United States Patent
Jones et al.

(10) Patent No.: US 7,035,755 B2
(45) Date of Patent: Apr. 25, 2006

(54) CIRCUIT TESTING WITH RING-CONNECTED TEST INSTRUMENT MODULES

(75) Inventors: Michael F. Jones, San Jose, CA (US); Robert Whyte, Ringwood (GB); Jamie S. Cullen, San Jose, CA (US); Naveed Zaman, Sunnyvale, CA (US); Yann Gazounaud, Sunnyvale, CA (US); Burnell G. West, Half Moon Bay, CA (US); William Fritzsche, Morgan Hill, CA (US)

(73) Assignee: Credence Systems Corporation, Milpitas, CA (US)

( * ) Notice: Subject to any disclaimer, the term of this patent is extended or adjusted under 35 U.S.C. 154(b) by 99 days.

(21) Appl. No.: 10/222,191

(22) Filed: Aug. 16, 2002

(65) Prior Publication Data

US 2003/0105607 A1   Jun. 5, 2003

Related U.S. Application Data

(60) Provisional application No. 60/313,141, filed on Aug. 17, 2001.

(51) Int. Cl.
*G06F 11/273*    (2006.01)

(52) U.S. Cl. ............... 702/121; 702/117; 702/118; 702/125; 714/724; 714/744

(58) Field of Classification Search ............... 702/121, 702/108, 117–120, 122, 123, 125, 178, 186–188, 702/189; 700/306; 714/724, 736, 700, 701, 714/814, 815, 775, 712, 718, 717, 730, 731, 714/742, 743, 744; 324/73.1, 158.1; 370/241, 370/242; 709/208, 209, 251; 717/105
See application file for complete search history.

(56) References Cited

U.S. PATENT DOCUMENTS

| | | | |
|---|---|---|---|
| 4,493,079 A | 1/1985 | Hughs, Jr. .................. 714/738 |
| 5,212,443 A | 5/1993 | West et al. ................. 714/724 |
| 5,237,659 A * | 8/1993 | Takats ........................ 709/236 |
| 5,461,310 A * | 10/1995 | Cheung et al. .......... 324/158.1 |
| 5,477,139 A | 12/1995 | West et al. .............. 324/158.1 |
| 5,646,521 A * | 7/1997 | Rosenthal et al. ....... 324/158.1 |
| 5,717,704 A | 2/1998 | Rosenfeld ................... 714/736 |
| 5,748,642 A | 5/1998 | Lesmeister .................. 714/724 |
| 5,854,797 A | 12/1998 | Schwartz et al. ........... 714/724 |
| 6,002,868 A * | 12/1999 | Jenkins et al. .............. 717/105 |
| 6,285,962 B1 * | 9/2001 | Hunter ...................... 702/117 |
| 6,331,770 B1 * | 12/2001 | Sugamori ................ 324/158.1 |
| 6,516,053 B1 * | 2/2003 | Ryan et al. .................... 379/21 |
| 6,591,385 B1 * | 7/2003 | Krech et al. ................. 714/718 |
| 6,625,557 B1 * | 9/2003 | Perkins et al. .............. 702/117 |
| 6,640,322 B1 * | 10/2003 | Schulz ........................ 714/724 |

* cited by examiner

*Primary Examiner*—Hal Wachsman
(74) *Attorney, Agent, or Firm*—Fish & Richardson P.C.

(57) ABSTRACT

Method and apparatus for circuit testing with ring-connected test instrument modules. A system for controlling one or more test instruments to test one or more integrated circuits includes a master clock and a controller. The test instruments are connected to form a communication ring. The master clock is connected to each test instrument and provides a clock signal to the one or more test instruments. The controller is connected to the communication ring and is configured to align counters of test instruments to derive a common clock time value from the clock signal. The controller is further configured to generate and send data words into the communication ring to carry the data words to each test instrument. The data words includes at least one data word specifying a test event to be performed, a common clock time value, and at least one of the test instruments.

33 Claims, 15 Drawing Sheets

| 37,36 | 35,34 | 33 | 32 | 31 0 |
|---|---|---|---|---|
| 00 | Orig | F/D | R/W | Data |

FIG.4A

| 37-32 | 31 0 |
|---|---|
| 000011 | Data |

FIG.4B

| 37,36 | 35,34 | 33,32 | 31 | 30,29 | 28 16 | 15 0 |
|---|---|---|---|---|---|---|
| 00 | Orig | 10 | G | 00 | Resource | Function |

FIG.5

| 37-35 | 34 | 33,32 | 31 | 7 | 6 | 0 |
|---|---|---|---|---|---|---|
| 001 | S/R | 11 | X | | Module ID | |

FIG.6

| 37,36 | 35-32 | 31 | 24 | 23-20 | 19-16 | 15 | 0 |
|---|---|---|---|---|---|---|---|
| 01 | Type | Clock | | Subtype | X | Fine | |

FIG.7

| 37,36 | 35-32 | 31 | 0 |
|---|---|---|---|
| 11 | Type | State History | |

FIG.8

| 3 | 2 | 1 | 0 |
|---|---|---|---|
| 0 | 0 | 0 | 0 |

FIG. 13A

| 3 | 2 | 1 | 0 |
|---|---|---|---|
| 0 | 0 | 0 | 1 |

FIG. 13B

| 3 | 2 | 1 | 0 | 31-0 |
|---|---|---|---|---|
| 1 | 0 | 0 | 1 | count |

FIG. 13C

| 3 | 2 | 1 | 0 |
|---|---|---|---|
| 1 | 0 | 1 | 0 |

FIG. 13D

| 3 | 2 | 1 | 0 | 31-0 |
|---|---|---|---|---|
| 0 | 0 | 1 | 0 | data |

FIG. 13E

| 3 | 2 | 1 | 0 | 15 | 14-0 | 15-0 |
|---|---|---|---|---|---|---|
| 0 | 0 | 1 | 1 | G | Resource | Function |

FIG. 13F

| 3 | 2 | 1 | 0 | 7-0 | 7-0 |
|---|---|---|---|---|---|
| 0 | 1 | 0 | 0 | dest. slot ID, 0x00=THIF 0xFE=predefined group 0xFF=all, including THIF | SM data |

FIG. 13G

| 3 | 2 | 1 | 0 | 7-0 | 7-0 |
|---|---|---|---|---|---|
| 0 | 1 | 0 | 0 | source slot ID, 0x00 = THIF | SM data |

FIG. 13H

| 3 | 2 | 1 | 0 | 5-0 | 9-0 | 11-0 | 3-0 |
|---|---|---|---|---|---|---|---|
| 0 | 0 | 1 | 0 | Type | Clock | Fine | X |

FIG. 13I

| 3 | 2 | 1 | 0 | Flow Control |
|---|---|---|---|---|
| 1 | 0 | 0 | 0 | Stop Flow |
| 1 | 0 | 0 | 1 | Resume Flow |

FIG. 13J

| 3 | 2 | 1 | 0 |
|---|---|---|---|
| 1 | 0 | 1 | 0 |

FIG. 13K

CIRCUIT TESTING WITH RING-CONNECTED TEST INSTRUMENT MODULES

This application claims the benefit of U.S. Provisional Application No. 60/313,141, filed Aug. 17, 2001, which is incorporated by reference.

BACKGROUND

The application relates to the testing of electrical circuits, such as integrated circuits.

Test instruments are used to test electrically the ability of a fabricated circuit to perform its intended function. Instruments designed for testing integrated circuits usually operate in conjunction with other devices, such as computing devices. These instruments and other devices collectively are referred to as integrated circuit test systems or test systems.

A characteristic feature of conventional test systems is that they include a master clock signal or several master clock signals, and they also tend to include at least one synchronization signal that is distributed globally, either simultaneously or in sequentially staged pipelines, to all testing circuits for the purpose of indicating when a test is to begin.

Tests of integrated circuits typically involve applying specified stimuli to one or more pins of the circuits and then determining the results by applying signals on one or more pins of the circuits to appropriate measuring instruments. A test system generally incorporates all necessary testing circuits in close proximity to the circuit or circuits being tested, which are driven by an external controller that communicates test requirements to, and collects test results from, testing circuits of varying functions. The function of a testing circuit can be the generation of any stimuli or collection of stimuli and the conducting of any measurement or collection of measurements as required by testing specifications for the circuit or circuits being tested.

SUMMARY

The system and techniques described here provide methods and apparatus, including computer-program products and test systems, for performing any one or more of a wide variety of tests—such as AC parametric, DC parametric, digital functional, SCAN-based structural, Direct-Access-Test mode structural, analog, functional, structural, operational or other tests—on a single or multiple circuits.

In general, in one aspect, the systems and techniques described here provide a control and data signal distribution architecture that permits a test system to synchronize measurements on one or more test instruments without having to distribute any signals in parallel to the instruments in the system other than a master clock. A test instrument, which may be implemented as a module, generally includes testing circuitry, as described above. A test instrument implemented as a module is referred to as a test instrument module. Besides having test instrument modules, the test system can include modules that serve other purposes. These other modules include, but are not limited to, pin electronics ("PE") module, precision measurement unit ("PMU") modules, time measurement unit ("TMU") modules, and device power supply ("DSP") modules. In general, the modules can provide any test function and any number and type of modules can be combined together, resulting in a multi-functional module.

Besides having different functions, modules can be of different configurations. In one implementation, the modules are of pin slice configuration. Modules of this configuration are referred to as pin slice modules, each of which can include memory, registers, and circuitry for generating test signals for one or more pins of a device under test. The pin slice configuration is described in commonly-owned U.S. Pat. No. 5,461,310 to Cheung and Graeve.

Regardless of configuration and function, the modules usually include circuitry for receiving a master clock signal from a master clock source and, furthermore, circuitry for receiving and transmitting signals as a member of a communication ring. The control and data signal distribution architecture described here permits communication between or among modules of the test system without distributing any signals in parallel to all of such instruments in the system other than a master clock.

In general, in another aspect, a control and data signal distribution architecture provides the ability to schedule different and unrelated tests for similar or dissimilar devices such that tests on one of the devices do not interfere in time or space with tests on another of the devices, even when the execution times of the tests overlap. The architecture described here also may provide an ability to extract data from multiple modules in an interleaved and structured format.

The architecture described here allows test processes to be encapsulated in the form of uniformly constructed test instruments having a uniformity in physical dimensions, power requirements, communication connections, and connections to one or several of pins (connection points) of a circuit or circuits to be tested. Furthermore, all or part of the test processes can be encapsulated in off-the-shelf instruments that have been adapted for communication, using the communication ring, with other components of the test system. As discussed above, test instruments, whether off-the-shelf or not, can be implemented as modules. Any module can appear at any point in the communication ring topology. Each module can operate as a stand alone module and include integral self test and diagnostic capabilities.

A test instrument module designed to operate in a test system as described here, may include circuitry to execute tests for which the test instrument module was designed. Test instrument modules in the test system execute tests either independently of each other or in synchronization with some or all other modules in the system, under control of a test controller and a system master clock. A test system thus constructed can be formed of as few instrument modules as one or multiple such text instrument modules, and in general as many as are desired for operation of the tests required to test some specific single or multiple integrated circuits.

The system master clock generates a system clock signal and distributes it in parallel to all modules in the test system. The modules are connected in a ring configuration by connecting the "from" port of a first module to the "to" port of a second module, then connecting the "from" port of the second module to the "to" port of a third module, and continuing to the last module to be connected, the "from" port of the last module then being connected to the "to" port of the first module. The data communication ports transmit control and synchronization signals around the ring of modules enabling each module to operate individually or in synchronization with any or all of the other modules in the ring. The system master clock and the test controller may or may not be included as modules in the ring. In either case, the test system master clock distributes the clock signal to all modules in parallel, and the test system controller generally initiates communications in the ring.

Each module can be connected to one or more signal or power pins of one or more of the devices to be tested. A module, such as a test instrument module, supplies current or voltage, or measures current or voltage, either in constant or time-varying manner, depending on the specific functions performed by the instrument. Each module can receive, maintain, and operate in accordance with scheduling information, enabling the module to perform test operations at appropriate times. Each module may include an internal time value register, and the scheduling information can include a list of tests to perform. The internal time value register is driven by the master clock and can be synchronized with time value registers in other modules in the text system. Such synchronization enables all modules to apply test conditions or conduct measurements at times synchronized correlated with application of test activities of other module in the system. Because test instrument modules can develop high resolution time signals internally, the synchronization can be done with a time resolution much less than one master clock cycle and with a skew from scheduled tests or measurements from other instruments in the system that is also less than one clock cycle.

In general, in another aspect, a system for controlling one or more test instruments to test one or more integrated circuits includes a master clock and a controller. The test instruments are connected to form a communication ring. The master clock is connected to each test instrument and, furthermore, is configured to provide a clock signal to the one or more test instruments. The controller is connected to the communication ring and, furthermore, is configured to align counters of test instruments to derive a common clock time value from the clock signal. The controller is further configured to generate and send data words into the communication ring to carry the data words to each test instrument. The data words include at least one data word specifying a test event to be performed, a common clock time value, and at least one of the test instruments, wherein the at least one of the test instruments is configured to perform the test event at the time specified by the common clock time value.

In general, in another aspect, a data and control signal distribution subsystem for an automatic circuit test system includes a communication ring, a master clock, and a dedicated clock signal path between each instrument in the test system and the master clock circuit. The test system includes test instruments for performing tests on a electrical circuit. The communication ring couples test instruments in the system to each other in a daisy chain fashion, where the communication ring is configured to connect to each test instrument through a single input port and a single output port. The master clock circuit provides a master clock signal. The dedicated clock signal path distributes the master clock signal to all test instruments in parallel. The communication ring is the exclusive path for test instruments in the test system to send synchronization signals and command signals to one another during a performance of a test, and the master clock signal received through a dedicated signal path is the exclusive global clock signal provided to test instruments in the test system.

In general, in another aspect, a computer program product, for controlling one or more modules that are configured to test one or more integrated circuits in accordance with a test process, includes instructions to cause a processor to: identify at least one of the one or more modules that is participating in the test process; identify a test thread among independent test threads for the identified instrument, the test thread comprising instructions for generating data words to be sent to other modules; and send the test thread to the identified instrument. The product is tangibly stored on machine-readable medium.

In general, in another aspect, a method for controlling and synchronizing one or more test instruments includes setting and maintaining synchronization of an internal time register of each test instrument to a common clock cycle by using a global clock signal of a master clock, the common clock cycle providing common clock time values for scheduling test events. The test instruments are connected in a communication ring to test an electrical circuit. The method includes inserting bus words into the communication ring to carry the bus words to each of the test instruments, the inserted bus words including at least one bus word specifying a scheduled common clock time value for performing a test event by a target test instrument. The method includes reading, by the target test instrument, the at least one bus word and using the scheduled common clock time value and the common clock cycle value in the internal time register of the target test instrument to determine when to perform the test event.

The systems and techniques described here can be implemented to realize one or more of the following advantages. The test system can synchronize measurements on one or more modules without distributing any signals in parallel to all of the modules other than a master clock signal. The test system can schedule different and unrelated tests for similar or dissimilar modules such that tests on one module do not interfere in time or space with tests on another device, even when the execution time of the tests overlaps. Moreover, the test system can have an ability to extract data from multiple instruments in an interleafed and structured for mat. The test system can be expanded to include additional modules for any stimulus or measurement by providing a definition of synchronization and scheduling rules that enable modules of whatever sort to be incorporated, synchronized, and connected to one or more pins of a circuit or circuits under test. The test system can execute multiple tests independently of one another without requiring that the tests be scheduled sequentially. The tests can be related to one another and applied to a single device or a group of similar devices, or they can be unrelated to one another or they can be applied to different devices or different portions of the same device. In particular, the system can be used to apply production tests and diagnostic tests on similar devices at the same time. The test system enables a result data word to be assembled from data derived at a point in time from multiple modules and to be presented to a test system controller as a single word of data. A test system implemented in this way can have an arbitrarily large number of modules synchronized to a finer resolution than a clock cycle without the necessity of costly distribution of many high-resolution signals. The accuracy of synchronization is limited only by the accuracy of the distribution of the clock and the accuracy each individual module on its own. Any module of the test system can inject a message into the serial ring even while a synching operation is in progress.

The details of one or more implementations are set forth in the accompanying drawings and the description below. Other features and advantages will become apparent from the description, the drawings, and the claims.

BRIEF DESCRIPTION OF THE DRAWINGS

FIG. 4A shows one format of a control data word.

FIG. 4B shows an example of an empty data word.

FIG. 5 shows one format of a function-resource component of a control data word.

FIG. 6 shows an example of a write flow control data word.

FIG. 7 shows an example of a confirmed sync word.

FIG. 8 shows an example of a partial sync word.

FIGS. 13A–13K show examples of words used in one implementation.

Like reference symbols in the various drawings indicate like elements.

DETAILED DESCRIPTION

Test System Overview

Figure 1:
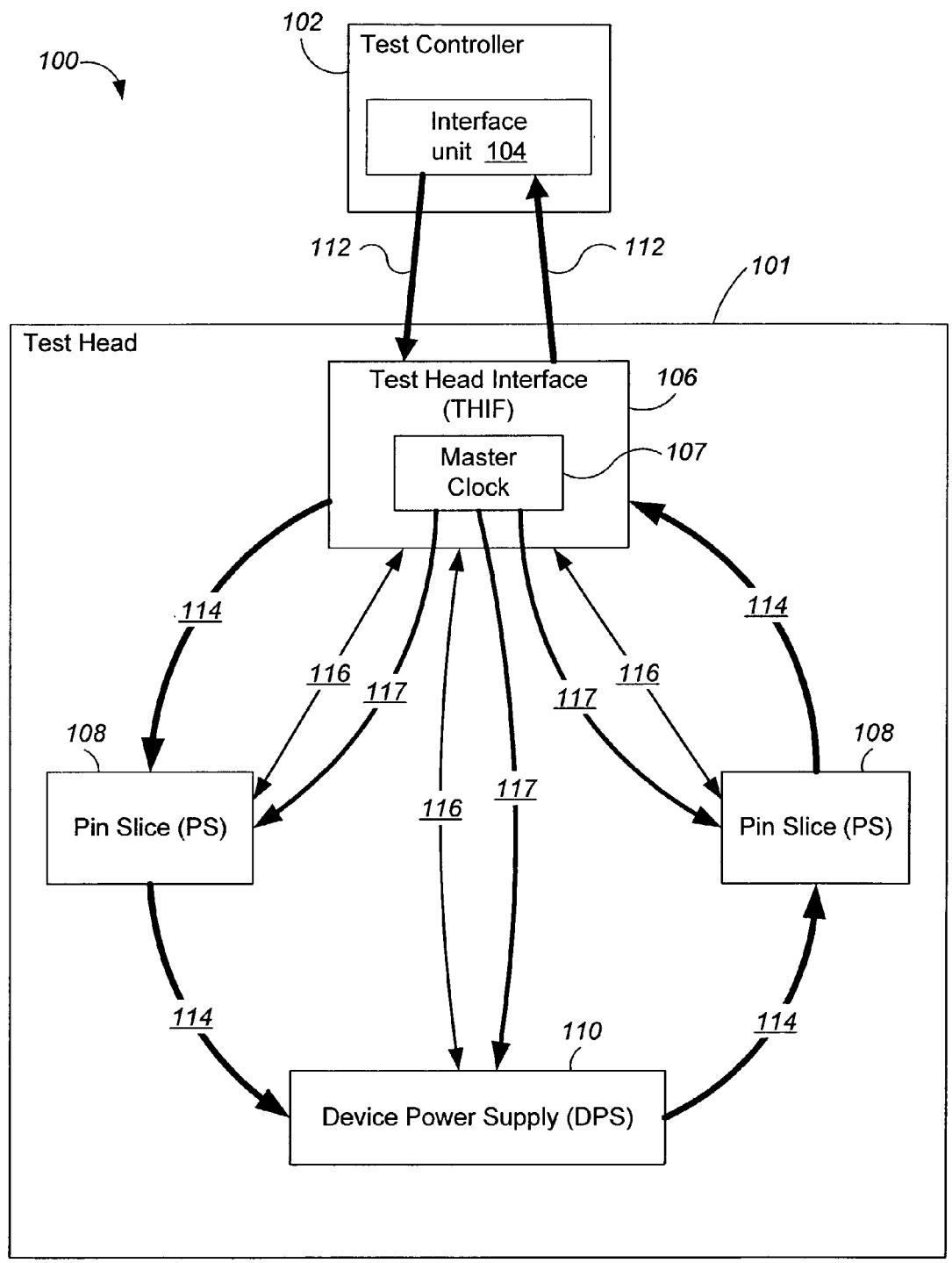
FIG. 1 is a block diagram of a test system.

As shown in FIG. 1, a test system 100 includes a test controller 102, that controls test processes, including assigning test functions and synchronizing their execution. To communicate with other components of the test system 100, the test controller 102 includes an interface unit 104.

In the implementation illustrated in FIG. 1, the test system 100, as is conventional, has a test head 101 on which pin slice modules, such as instrument modules, PE modules, TMU modules, PMU modules, and DSP modules, can be physically installed. When the system is configured to test one or more circuits, the modules will include a test head interface ("THIF") 106, one or more modules of testing circuitry such as a pin slice module ("pin slice" or "PS") 108, and generally one or more power modules such as a DPS module 110. The test head interface 106 is different from other modules in that it need not include test instrumentation that provides signals to, or measures signals on, a circuit being tested. The module designated as the test head interface exists to facilitate communication between the test controller 102 and the other modules.

Although particular modules have been described, the test system 100 can incorporate any number and any types of modules conforming with physical size and communications standards of the test system design. These standards are described below.

The test system 100 also includes a system status monitor ("SM"). The SM does not participate in testing, but is configured to program programmable elements, such as Field-Programmable Gate Arrays ("FPGAs") that are included on individual modules, to receive status signals from the modules indicating if they have detected any malfunction such as power failures or excessive heat conditions, and to issue RESET commands in case detected conditions warrant it. In one implementation, communication for system status monitoring is accomplish by using data words called SM messages or words.

The test system 100 includes a controller link 112 for communications between the test controller 102 and the modules of test system 100. The test system 100 also includes a serial communication ring 114 for communications among the modules and for communication between the modules and the test controller 102. The ring 114 is established by connecting the transmit port of one module to the receive port of another module until all modules are included. Then, the transmit port of the last module is connected to the receive port of the first module, resulting in a ring configuration. In one implementation, the ring 114 supports a transfer rate of 800 megabytes per second (MB/s). Ideally, the link 112 supports the same data transfer rate as the ring 114.

The test system further includes an SM link for exchanging status monitoring messages between the test controller 102 and the modules. The SM link can include link 112, over which the test controller 102 receives and sends messages to the test head interface 106, and also links 116, over which the test head interface 106 conveys messages exchanged between the test controller 102 and the modules. Alternatively, the SM link can be established by separate wires directly connecting the test controller 102 with each module. The SM messages can either pass through the SM link or through the serial communication ring like other data words.

The system 100 includes a system master clock 107, which in the illustrated implementation is included in the test head interface module 106. Alternatively, the system master clock can be included in any of the other modules, or it can be a separate device entirely, unconnected with the test system except to provide clocking signals. The module having the master clock will be referred to as the master clock module. The master clock module generates a master clock signal (the "master clock") and distributes this signal in parallel and directly to each module in a clock link 117 that is separate from the controller link 112, the ring 114, and link 116. The clock links 117 can be implemented using a co-axial cable from the master clock module to each of the other modules.

Test System Operation

In operation, test controller 102 and master clock module work together to control and synchronize all the modules. The test controller 102 controls the modules, including commanding modules to execute their respective test functions at a certain times, as required by the test process being executed. The test controller 102 also sends test vectors to the modules, read test results from the modules, and communicate other operational commands. The test controller communicates its control signals by sending data words into communication ring 114 through its connection with the test head interface 106. In one implementation, all system communication takes place by data words getting inserted into the ring. Any component can communicate with any other components using this technique. A control data word from test controller 102 enters communication ring 114 through test head interface 106. A data word including commands to any or all of the modules will be referred to as a control data word. Control data words can represent either a write or a read operation. Control data words are further described below. Normally, control data words are generated by test controller 102. Sync data words are generated by instruments such as 108 and 110 during the process of executing tests whenever the test flow calls for them. Alternatively, one or more modules can generate a control data word. For example, a first module can generate a control data word to read the register of a second module. Furthermore, in this alternative implementation, the test controller 102 can generate a sync word.

The test head interface 106, in response to a particular command from test controller 102, synchronizes all modules to a common clock cycle. The distribution of the master clock then allows the modules to synchronize themselves to a resolution that is finer than a clock cycle using conventional techniques. The synchronization to sub-clock cycle resolution enables all modules to execute test functions at times correlated with other test activities of other modules in the system. This correlation includes the ability to schedule a test or measurement at a time resolutions much less than one clock cycle and whose skew from scheduled tests or measurements from other modules in the system is also less than one clock cycle.

During a test process, the modules coordinate with each other to execute tests according to the test process being executed. The modules coordinate by using the master clock signal and the test vectors received from the test controller 102. As discussed, the modules are synchronized to a common clock cycle and rely on the master clock to further synchronize to a sub-cycle resolution. Modules can confirm events of a test process by sending and receiving sync data words into and from the communication ring 114. Sync data words thus can enter the ring 114 at from any module. Sync data words are further described below.

Once a data word enters communication ring 114, the ring 114 carries the data word around the ring of modules. At each master clock cycle, a data word usually proceeds to the next slot which can be a downstream module, or if a module has multiple pipe stages for data words, the next pipe stage in the module. A data word stored in the last pipe stage in a module is sent to the adjacent downstream module. Thus, when a module has multiple pipe stages, each pipe stage keeps a data word for one master clock cycle. Pipe stages are further described below.

A module can also temporarily retain, up to some maximum time, a data word for processing. The maximum depends on the configuration and operating parameters of the test system and is designed to prevent bus timeouts. After processing is complete, the module can return the data word back to the communication ring.

A cycle is complete when each module has received the data word and it has been sent back to the originating module. A module executes its test function in response to and in accordance with a received data word, including waiting until the appropriate time to execute and coordinating with any or all of the other modules.

In alternative implementations, the system master clock can be placed so it is not part of any module in the ring 114, or the test controller 102 can be included in the ring 114. In all alternatives, the system master clock distributes a clock signal to all instruments in parallel, test controller 102 generally initiates and terminates control communications in the ring, and any instruments can insert sync data words into the ring.

Method for Testing One or More Circuits

Figure 2:
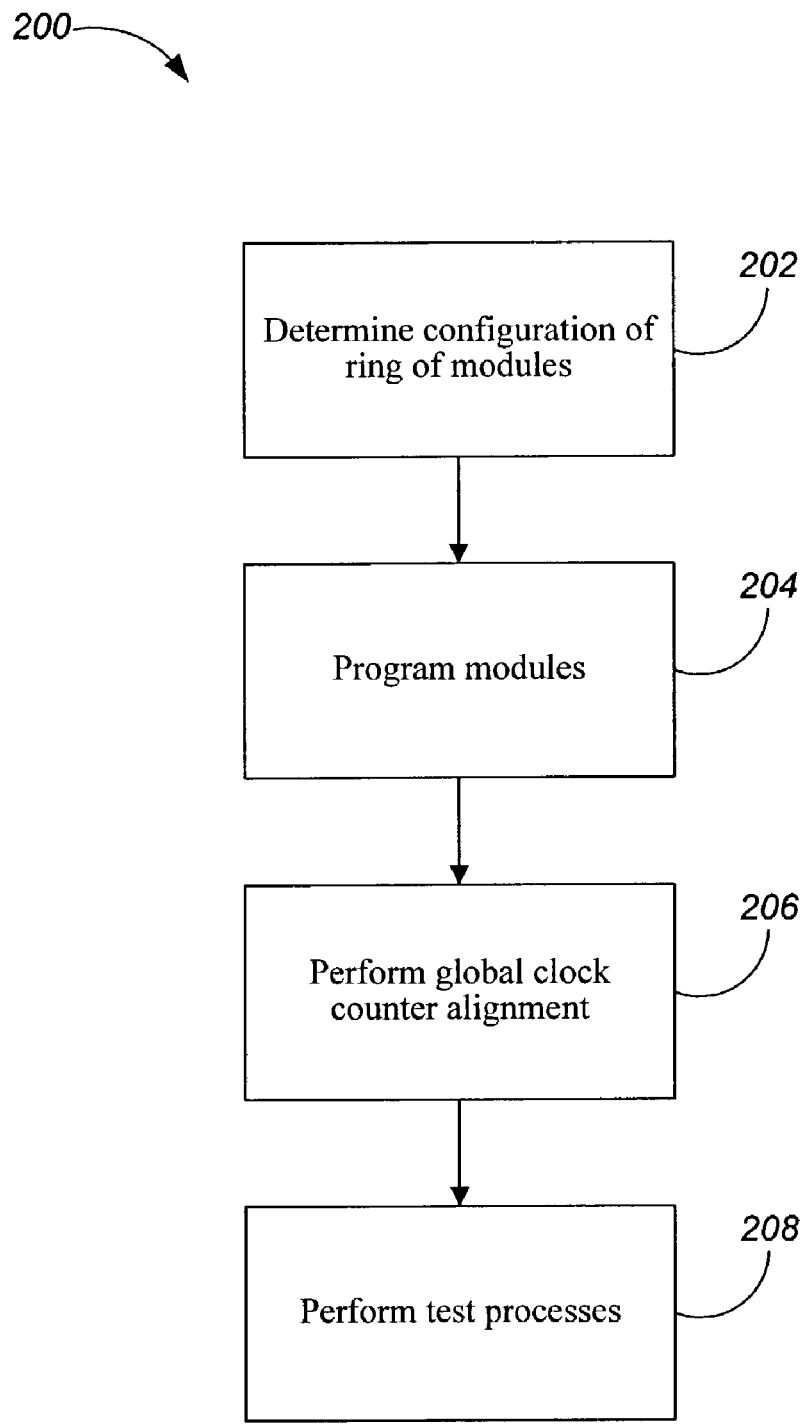
FIG. 2 shows a method for testing one or more circuits.

FIG. 2 shows a method for testing one or more circuits. A test system, such as the one shown in FIG. 1, performing method 200 determines the configuration of the ring of modules (step 202). As discussed, the ring can include any number and any type of test instruments that will be used to test the one or more circuits. In one implementation, a test controller, such as the test controller 102 (FIG. 1), determines the test instrument type, the test instrument position in the ring, and ring delay. Ring delay determination is further described below. The test controller also can perform other determinations that are well known in the art.

The test system programs the modules (step 204). Programming includes programming clock offset values into modules, allocating resources and function codes, as well as configuring instruments for the mapping of read back data. Clock offset values, code allocation, and read back mapping are further described below.

The test system performs a global clock counter alignment (step 206). Global clock counter alignment is also referred to as synchronizing to a common clock cycle. The alignment causes the modules to set their respective counters to the same count on exactly the same clock edge. All the counters will reach a count of 5, for example, at the same time. In one implementation, the test controller uses a master clock, such as master clock 107 (FIG. 1), to perform the global clock alignment. The controller 102 broadcasts a message, using the mechanism described above, to reset the counters of each clock. The delay between the time when the reset message is sent and when it reaches a given module is known because the topology of the ring of modules is known. The test controller can, thus, program each module with a clock offset value that represents the delay. The module can use the clock offset value during the reset operation to delay resetting its counter. In this way, every module of the test system resets its respective counters to zero, or alternatively any other count, on exactly the same clock edge.

The test system performs the test processes and collects test data (step 208). As discussed, test processes can include one or more test operations to be executed by the one or more test instruments. In one implementation, the test controller sends commands to the instruments to control the test process and to collect test data. During testing, the instruments themselves can send words, such as a partial sync word, to each other and to the test controller to execute tests. During testing, sync words can be freely interchanged with other types of words.

Common Module Architecture

Figure 3:
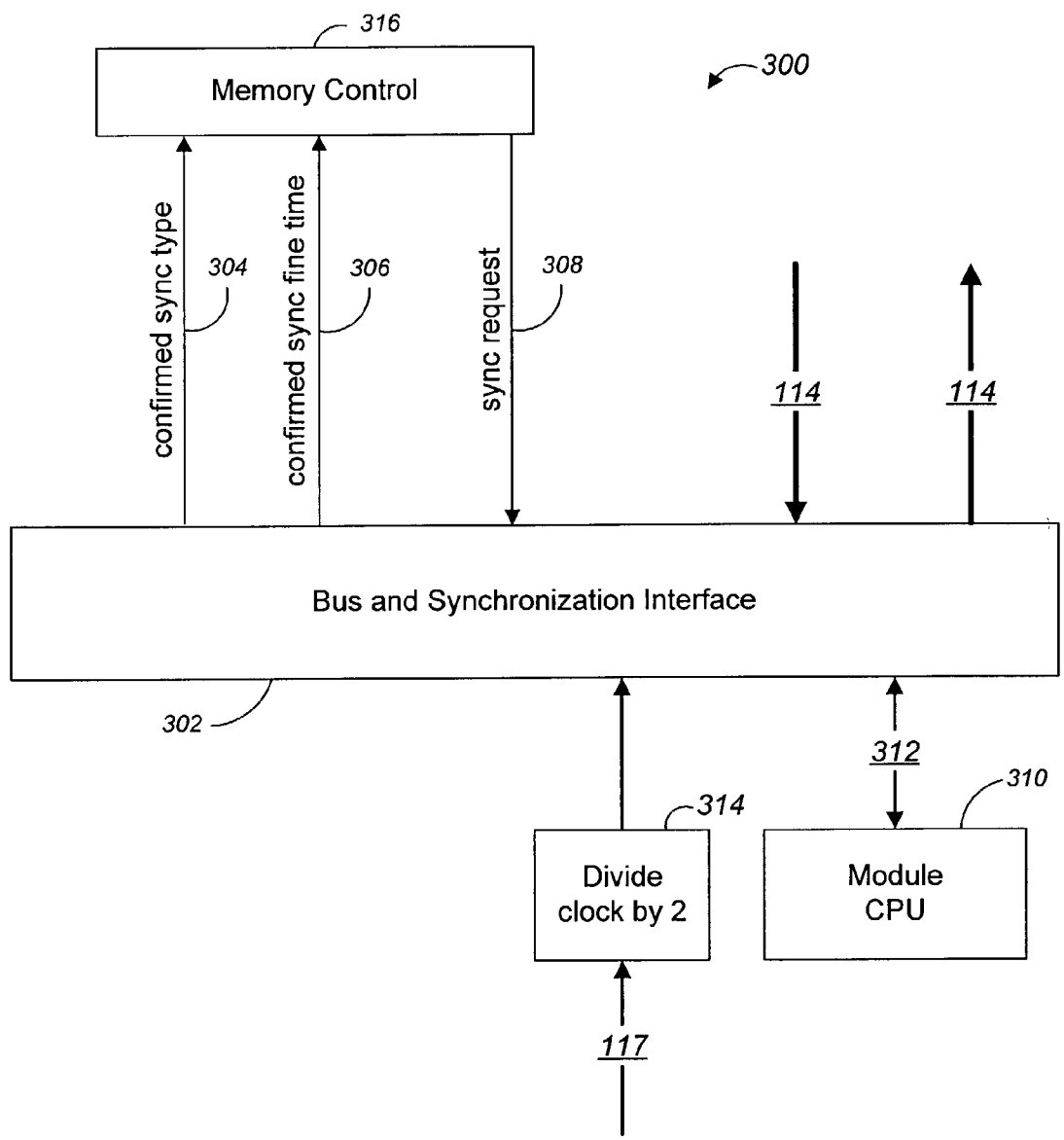
FIG. 3 is a block diagram of a common module architecture for a test system module.

FIG. 3 illustrates one implementation of a common module architecture 300. As shown, architecture 300 includes a bus and synchronization interface 302, which can conveniently be implemented on an FPGA. The bus and interface 302 provides an interface for the "from" port and the "to" port of the ring 114. To support a module that has a CPU 310, the bus and interface 302 has an interface for a CPU bus 312. The bus and interface 302 also has an interface to receive, from a divide-by-two divider 314, the master clock signal 117 divided by two. With a 400 MHz master clock input, the divider 314 provides a 200 MHz master clock for module components. Alternatively, when the master clock signal is 200 MHz, the divider 314 is not needed. Instead, the architecture provides circuitry to double the clock signal, such as a multiplier. The bus and interface 302 is also configured to provide control data word bits to the appropriate circuitry of the module. For example, it provides an interface for bits representing a confirmed sync type 304, a confirmed sync fine time 306, and a sync request 308. The bus and interface 302 also has an interface for board level support signals. A pin slice module will include memory control circuitry 316 configured to synchronize the pin slice with the rest of test system and to store test function and execution data. The bus and interface 302 can also be programmed, or include circuitry, to perform other common operations described in this specification.

Control Operations and Control Data Word

FIG. 4A shows one implementation format of a control data word, which includes two components, a bus interface component and a function-resource or data component. The first component, bits 32–35, prepares modules to receive data represented by the second component. The second component, bits 0–31, includes data specifying a resource, function, or both. That is, the function-resource component specifies which resources or functions are to be read or written by subsequent control data cycles.

In the bus interface component, the R/W bit is 1 for a read cycle, and 0 for a write cycle. A control data word representing a write operation will be referred to as a write control data word and a control data word representing a read operation will be referred to as a read control data word. The F/D bit is 1 for a function-resource cycle and 0 for a data cycle. A data cycle is either a read cycle or a write cycle. If F/D is 1, then R/W must be 0. The illustrated format allows for future expansion to allow modules such as pin slices to originate and send data words. The original bits 34–35 are thus 00.

A read cycle originates with all data bits of the data word zero. Each addressed module performs an OR operation on its stored data with the received data bits. An addressed module can delay the passing on of the read cycle word (subject to some maximum). The maximum is determined by requirements of the test controller, and is set to prevent bus timeouts. It will typically be smaller than one millisecond to allow internal pin slice operations to occur.

Ring 114 has multiple slots, with one slot occupying one stage in the ring. Slots on communication ring 114 can be empty, to be filled by any module. FIG. 4B shows an empty word. Bits 32–37 contains the empty word tag "000011".

FIG. 5 shows one implementation format of the function-resource component. (A resource refers to one or more modules and a function refers to test event. The test head interface 106 transmits this data word to the communication ring 114 when test controller 102 changes the data word. As shown, the function code is 16 bits. Every instrument decodes specific common registers on "page 0" (i.e., function codes 0000–003F). Other function codes that are required for a particular type of instrument can be allocated by software during an allocation process. The resource code is 15 bits, suitable for addressing about 32 thousand resources. When G=1, this is a group address representing a group of resources. All modules provide at least 4 thousand locations decode. Any instrument providing less than the full 32 thousand decode must ensure that the most significant bits ("MSBs") are zero. The special resource code 0xFFFF is decoded by all instruments to mean "all resources". The resource code 0xFFFE is reserved for use in logical manipulation of participate masks. Logical manipulation of participate masks is further described in U.S. Pat. No. 4,493,079 to Hughes, which is hereby incorporated by reference in its entirety. When G=O, bits 30–16 are resource number codes as follows: 0000–00FD are hard-coded slot numbers (0–253) and 0100–7FFF are channel numbers, allocated by software according to instrument. Allocation of function and resources codes are further described below. The hard-coded slot addressing is only needed to access the page 0 registers required for other parts of the configuration process, including the setup of the "channel number" based decoding.

Alternatively, the resource code can be 13 bits, suitable for addressing 8,192 resources. When G=1, this is a group address representing a group of resources. All models, in this case, provide a full 8K locations decode. When G=0, bits 16–21 are pin number (0–63) and bits 22–28 are pin slice number (0–126). This format provides considerable expansion potential. A pin slice number of 127 implies access to one of sixty-four modules, such as DPSs, that are not pin slices. The spare bits are for future expansion and are thus 00.

The above describes particular implementations, to which the resource and function codes are not limited. Rather, the resource and function codes can be encoded in any manner to specify particular modules, components of the modules, and their respective functions.

Allocation of Function and Resource Codes

To ensure efficient use of limited address space and, furthermore, to allow for third-party instrument development, the function code and resource code spaces can be allocated at configuration time by the test controller 102 using runtime software.

In one implementation, each instrument type can be allocated a unique range of function codes from within the 16-bit space 0040–FFBF. The range FFC0–FFFF is reserved for the interface unit 104 (FIG. 1). The number of consecutive codes requested can be made by, e.g., a page 0 register, FUNCBASEADDR (function base address). All instruments of the same type must request the same number of registers.

Each individual instrument is allocated a unique range of resource codes from within the 15-bit "channel number" range 0100–7FFF. The number of consecutive codes requested can be made by, e.g., a page 0 register, RESBASEADDR (resource base address).

Page 0 registers are written by software, such as computer programs of the test controller, to give the allocated start addresses of the function and resource codes. Function codes can begin at any address. Resource codes, however, can be allocated to start at a round number. That is, they must be a multiple of a power of two equal to or larger than the requested length. Both resource and function codes occupy a single block. Instruments must not use any function codes or resource codes beyond the length requested.

Write Buffering in the Communication Ring

The test controller 102 is not normally made to wait for write cycle completion. (A write cycle is one circulation of a write control data word through communication ring 114 and a read cycle is one circulation of a read control data word through communication ring 114.) Write operations are transmitted as fast as they are received from the test controller. However, modules are not required to process write operations at the full 200 MHz rate. They can independently and locally determine processing time and, furthermore, can use different times for different test functions. To achieve this flexibility without software overhead, each module has its own first-in-first-out ("FIFO") registers implementing write cycle buffering.

To avoid FIFO overflow, each module uses a basic FIFO overflow control technique, such as is described below. In one implementation, each module's FIFO is 2K deep. When a module's FIFO reaches a full threshold, such as 75% full, a "Stop" flow control data word is sent to the test head interface 106, together with the module's identification. The test head interface 106 consumes all such words and stops test controller 102 from sending more write data words by some form of exception mechanism, such as holding up acknowledgements. Once the FIFO drops to a resume threshold, such as 70%, full, the module sends a "Resume" flow control word, and normal operation re-commences. Timeouts and bus errors are thus avoided. FIG. 6 shows a write flow control data word. An S/R value of 1 represents a "stop", and an S/R value of 0 represents a "Resume".

Because of buffering, it is possible that read operations will overtake write operations, giving unexpected results. Therefore, modules are required to hold up a read operation until all pending writes have occurred. A write occurrence is defined according to each module and each function. However, as a minimum, a register write immediately followed by a read of the same register is guaranteed to read back the newly written data.

The described overflow control mechanism can have significant performance impact. Thus, near-overflow conditions are avoided by other means, such as auditing software processes generating sequential writes to assure compliance, or by providing sufficient FIFO memory.

Read Back Mapping

To support the read back of data words captured across multiple instruments, mapping of certain read back data, such as those of captured random access memory ("RAM"), is supported on certain modules such as those that are digital. This feature is of particular use for reforming digitized analog samples captured by multiple digital pins. Reforming is accomplished by re-constituting the sampled word as the read operation progresses around the serial communication ring 114 (FIG. 1). This feature can be combined with the format translation feature discussed below with respect to uplinking. Instruments can insert bits in any position in the word composited. Extraction can be based on a rotating mask, effectively deserializing the captured data.

DMA Read Mode

To increase the speed of block reads, a direct memory access ("DMA") read mode can be provided. No modules apart from the interface unit 104 and the test head interface 106 need to process read operations differently during the DMA read mode.

The interface unit 104 implements a special DMA-start-address register and a DMA-count register. If these registers are written prior to a read operation, that operation is repeated the given number of times (as specified by the count value) and results loaded into test controller memory, starting at the given location.

The use of this mode may be restricted because other test controller bus operations might not be possible during the DMA read mode. It is possible, however, to perform synching operations while in the DMA read mode. A DMA operation can be immediately followed by a non-DMA operation, which can be sent into the serial communication ring 114 without waiting for the results of the DMA read.

DMA Write Mode

The DMA write mode is similar to the DMA read mode, except that in the write mode, data is being sent from the test controller to a module. To further accelerate the loading of memory, the test head interface 106 can include data decompression programs to decompress compressed data sent from the test controller 102. Decompressing can be achieved using normal write operations. Neither the interface unit 104 or the instruments need to perform special steps; it is the test head interface 106 that implements this feature. Alternatively, each modules can include decompression programs so that the test head interface 106 need not excessively consume computing resources to decompress all data from the test head controller.

Performance of Bus Interface

Latency of normal writes is variable, depending on the position of a module in the ring relative to the test head interface 106. A normal write is one from the controller 102 to a memory in a module. Latency of normal reads from a pin slice, for example, depends primarily on the numbers of modules, and the number of pipe stages per module. A normal read is one where the test controller 102 initiates a read request and receives a data word from a module. A pipe stage refers to a buffer in a module for holding and processing data words. As discussed, modules moves data words from one pipe stage to a next pipe every clock tick. In an implementation having 64 modules and two stages per modules, read latency is approximately 650 nanoseconds ("ns"). The test system can sustained a throughput of 800 MB/s for read or write operations to the same resource and for a given test function (presuming that the module and test controller 102 can keep up and that there is no synchronization activity to consume bandwidth).

Multiple Device Testing and Site Selection

As is well known in the art, test systems are often used to test more than one device at the same time (i.e., parallel testing). One implementation of the test system 100 facilitates parallel testing by supporting multiple test sites that use individual software threads per site. Sites must be enabled or disabled depending on whether or not devices to be tested occupy the sites or have failed and no longer need to be tested, but must remain fixtured until a multi-site handler can remove them. Simultaneous register writes to all enabled sites and all resources are accommodated in the tester using participate memory and a special software tool called a site mask.

The test system can support independent test head register access threads. Each access thread includes its own resource code and site mask. For each thread, the test head interface 104 maintains an independent current site number register and site mask registers allowing for 1K sites.

The test controller automatically updates the current resource code and site mask as needed. The test controller performs the update prior to the first read or write operation following a thread switch. Not all site mask locations may be written; they must start from zero. Instruments can support the full 1K sites but must support at least 256 and, furthermore, must fully decode the site number and mask.

Synchronization Operations and Sync Word

All synchronization between the test controller 102, and the modules uses the same communication ring and message protocol. The test controller 102 and any module can use a sync word for appropriate internal purposes and can generate a sync word. Any component of the test system can generate a sync word.

There are partial sync and confirmed sync words. A confirmed sync word may be generated from a partial sync word, or it may be generated directly. A confirmed sync word is a message that a given sync event, such as a test function, has definitely occurred. A confirmed sync word gives the time of that occurrence. Global syncs, e.g., Start, Stop, Fail, are special cases of confirmed sync. A confirmed sync word is terminated in the ring by the module that originated it.

A partial sync is the mechanism through which the, test system 100 coordinates one or more events when the information needed to do so is distributed among two or more modules. Partial syncs combine synchronization information over multiple modules, which is an optional feature. Partial syncs combine pins spanning multiple modules, so a sync event only occurs when all pins are at a pre-defined pattern or some other set of coinciding conditions occur.

The test head interface 106 can monitor all confirmed syncs, including Fail, for debug and flow control purposes. All confirmed syncs are passed to memory controller devices such as memory control 216 for use by them if appropriate. Simultaneously, the fine resolution event time (i.e., the sub-clock cycle time) is also passed to all instruments in the ring, for precise event positioning. For partial syncs, the test system 100 does not pass this fine resolution event time.

FIG. 7 shows one implementation of a confirmed sync word. Type represents the type of event being synchronized and, in one implementation, is a 4-bit sync type. In this implementation, there are at least fifteen independent general purpose syncs, with Type ranging from 1 to 15. These fifteen can be used for partial or confirmed sync words. Type=0 is only used by confirmed sync words. This indicates one of 16 independent global sync types, specified by the Subtype field. Table 1 shows the sync types in one implementation.

TABLE 1

| Type | Subtype | Usage |
| --- | --- | --- |
| 1–15 | X | General purpose sync |
| 0 | 0 | Global start |
| 0 | 1 | Global stop |
| 0 | 2 | Global fail |
| 0 | 3–15 | Spare global syncs |

Any module can fully and concurrently participate in multiple synchronization operations of any type. In one implementation, there are two general purpose syncs per pin slice—one per group of pins controlled by the same memory controller. As shown in FIG. 7, the clock field is an 8-bit global clock number, giving the time of the sync event to a resolution of 5 ns (i.e., the 200 MHz clock).

All modules in the system are required to have their internal time value registers in step, so the synchronization mechanism works at the correct time across the entire system. The counter alignment process that accomplishes this is described below.

The fine field subdivides the 5 ns resolution to approximately 76 femtosecond ("fs") steps. This feature can only be used with confirmed syncs. That is, syncs that are generated by multiple modules only have 5 ns resolution. When a partial sync is converted to a confirmed sync, the fine field is set to zero.

A confirmed sync specifies the time that the in-sync state commenced. Any device using the confirmed sync time must therefore add a fixed (and programmable) latency before acting on it. Global confirmed syncs obey the same rules: latency must still be added (the amount added depends on which module is generating the sync word).

FIG. 8 shows one implementation of a partial sync word. In this implementation, type is the 4-bit sync type, similar to the type for a confirmed sync word. Type has a value in the range of 1 to 15. State History is a bit field of the in-sync status for the previous 32 clocks. A bit value of 1 indicates an in-sync condition. An all-zero value indicates there is no sync condition and is not transmitted.

A specific module generates partial sync words for a given sync type, based on its internal in-sync condition. The module that is next in the ring and that is involved in generating the same sync type monitors for such a partial sync word. Such a module performs a logical AND of the incoming state history and its internally generated state history for the same time frame. The resulting state history is passed on only if it is non-zero. This process continues through additional contributors, if any.

Once a non-zero partial sync word of the correct type reaches the originator, a sync can be confirmed and the sync word is converted to a confirmed sync. Separate confirmed syncs are generated for each set bit. Latency for processing this is acceptable because confirmed sync words include a clock number. Since partial syncs are only resolvable to a 5 ns clock period, no fine delay information is possible.

For correct interpretation, the time frame represented by the state history must be determinate. The protocol is that state history and global clock number (see the confirmed sync description) are in fixed alignment. For example, global clocks 0 through 31 are nominally in the first state history, 32 through 63 are in the second state history, 64 through 95 are in the third state history, and so forth for each next state history. Partial sync words are only transmitted when relevant, i.e., when non-zero.

Each module has a dial-a-pipe scheme (which in general is a variable length FIFO scheme) to ensure that its local state history is generated in approximate step with a potential inbound data word. These words can be aligned with sufficient accuracy for simple end-of-pipe processing because the sequential order and instrument-to-instrument communication ring delay of all instruments in the communication ring is known when the ring is configured. (Ring configuration is further described below in the section titled "Ring Configuration".) Note that extra words inserted in to the ring 114 by sync word insertion can affect this number when they are placed downstream of the data word because they delay the data word. The inserted words causes a worst case uncertainty of less than the state history size. By similar reasoning, the originating module is able to convert confirmed bits into global clock numbers. Sync word insertion is further described below.

Partial syncs are optionally time-qualified, so that they only occur in multiples of a certain interval. See the section below describing periodic triggers.

Sync Word Insertion

To avoid congestion-related problems, modules can insert a sync word into the ring by means of an extra clock stage. The extra stage is only used if there is a non-empty word preventing the sync word from being transmitted.

The extra stage is deleted by absorbing the next empty word. Because in the particular implementation being described there are a maximum of 31 syncs, the total ring length can transiently grow by a maximum of thirty-one stages. A sync overflow error is generated if a module needs to transmit a new sync word after it has used an extra stage but not yet release it.

Periodic Triggers

For simple, deterministic periodic triggers, the test head interface 106 can generate regular confirmed sync words, using the spare global trigger types. This capability can be used to generate least common denominator type triggers, as might be needed in a system emulating a split-timing, multiple time domains feature, which provides two independent test frequencies in the same test.

The period is programmable and is expressed in terms of half periods of the 200 MHz clock, i.e., 2.5 ns resolution. A 24 bit counter can be used, reset to a programmable initial phase by global start. This feature can also be used to qualify any partial sync, so such syncs are only confirmable on a periodic basis. In this case, the periods are whole numbers of the 200 MHz clock.

Global Clock Counter Alignment

The sync mechanism uses the concept of a global clock number, which must be kept in step across all modules for correct operation. The following paragraphs describe one technique for resetting simultaneously the necessary 8-bit counters over the entire system. Any other technique for accomplishing the same result can be used.

The test controller 102 broadcasts a message to all modules, using the described communication ring mechanism, to reset the counters. This message can be part of a general RESET command.

The sequence and timing of the ring is known. Thus, the number of 200 MHz clock cycles required for a word to propagate from any instrument to any other instrument is known. The test head interface 106 pre-programmed each module with a clock offset value, which each module uses during the reset command to delay the counter reset.

Using these offsets, the reset operation will result in all counters across the system reaching zero on exactly the same clock edge. No sync operations can be in progress during this process.

400 MHz to 200 MHz Alignment

To ensure correct operation of the bus, the conversion of the 400 MHz system clock to the 200 MHz needed for the bus clocking must be in-phase on all modules. One way to achieve this is to gate the 400 MHz clock at power-up so it is only generated after it has stabilized and after all modules have been reset (including a divider 314 (FIG. 3)) by a system status controller. Although this operation need only be performed once, the SM can initiate such a sequence at any time.

Alternatively, a 200 MHz master clock can be used in lieu of the 400 MHz clock. This alternative does not require a divider but may require instead a multiplier to generate a 400 MHz signal to components of a module that requires such signal.

Sync Mechanism Performance

Latency of confirmed syncs are similar to read operations. The latency of partial syncs is more than twice the latency of confirmed syncs, because the partial sync word is converted into a confirmed sync, which must traverse the ring again.

Partial syncs can make use of significant bandwidth. In the worst case, partial syncs consume 50% of the entire bus bandwidth. If, due to congestion, a sync word cannot be placed on the ring, the FPGA of the source module of the sync word waits for the next empty slot. The maximum wait time must be included in the latency and, thus, also the programmable offset between the time of the sync event and the time it is acted upon. In any event, this time cannot exceed the a programmable limit of the partial sync word (i.e., 31 periods of the 200 MHz clock for the described implementation); otherwise the partial sync mechanism will fail. If an empty slot is not available before the programmable limit (max 31), then a bus-overflow error is flagged using the SM interface.

Fail Handling

Confirmed sync messages can be used to implement a fail mechanism. Some modification are necessary to the standard protocol, however, because fails can be generated simultaneously (or nearly simultaneously) across the entire system and because components responding to the fail may need to act in unison to avoid complications for the device under test ("DUT"). Any module can generate fail messages. However, generation is suppressed if the same module has already generated a fail message, or if a fail message has already been received. The time value in the sync message is that of the start of the test vector. Thus, the clock number alone may be used to compare the relative times of fail messages.

An instrument removes a fail message from the ring only if all the following are true: The instrument has generated a fail message; the message type is the same as the instrument used; and the message clock number is the same as the instrument generated or received, if lower.

Fail messages are scheduled for execution in the normal way, however, if another fail message arrives before execution, its time takes precedence if it is earlier than the time of the original fail message. If the time value (for which only the clock number need be compared) is greater or equal, the duplicate message is ignored. Because such a scenario is not permitted with other sync types, this protocol can be the general case without causing any undesired effects.

Determining System Configuration

It is desirable that the configuration of the system be determinable automatically, so the system may be programmed and debugged without the well-known problems caused by incorrect system configuration files. One method for determining ring configurations is described below.

1. Module Type

The nature of each module is determined. Each module includes a small EEPROM storing module information such as module type, revision, and history. This information can be accessible through the SM interface.

2. Module Position

The test system 100 includes one or more mechanisms for determining module position. These mechanisms include inference of position from a unique SM connection and from a fitted load board. Because of possible gaps between modules, ring position is insufficient. Any technique by which a module can read its position from the slot where it is installed would be sufficient.

3. Ring Delay

For proper operation of the ring, the delay between modules, i.e., the time it takes a word to get from one module to the next one on the ring, must be known. Internal delays can be known by the design specifications of the module type, and are not significant to operation of the ring.

Normally, modules are sufficiently close for there to be no added pipes to their adjacent ring stages. However, longer connections, e.g., for debug or to bridge large gaps, may be necessary. Provided such connections have delays that are multiples of 5 ns (the 200 MHz clock cycle), ring operation works properly. However, to align the internal clock counters correctly, the position of such delays must be known.

One solution is automatic determination of ring delay. This technique is described below. The following technique is performed after power-up to determine if any inter-module links have significant delay. The technique is performed under controlled conditions; no other bus or sync operations can be in progress.

a. The test head interface 106 sends a resource+MEASURE_TOKEN_DELAY function addressing all modules.

b. The test head interface 106 sends a 200 MHz burst of 33 data writes, with value 00–20 in the least significant 6 bits. Optionally, to ensure burst operation, these writes can be synthesized by hardware, rather than software.

c. The test controller uses conventional read operations through the test head interface 106 to recover the determined delays from each module—again with MEASURE_TOKEN_DELAY.

Each module decodes and passes on the writes, as normal. However, it also does the following abnormal actions. If bit 5=0, bits 7–11 are reversed in direction. The inputs from the previous module in the ring become outputs to the previous module, and the outputs to the next module in the ring become inputs from the next module. Further, the value being received from the next module on bits 7–11 is subtracted from the current value of bits 0–4 and the result stored in a register. The current value of bits 0–4 is also driven out of bits 7–11 to go back to the previous module in the ring.

If bit 5=1, bits 7–11 are returned to their normal direction. The subtraction detailed above can still take place, assuming the input data was registered. The re-enabling of the bit 7–11 drivers is delayed several clock cycles to avoid conflicts. The stored results of the subtraction is the round trip delay from test controller 102 to the module, in clock ticks, plus a small fixed pipeline overhead.

An advantage of this technique is that the determination of the clock value is very rapid. A disadvantage is that there are several signals in the ring bus which must be bidirectional in implementation.

A second technique is the following:

In the set of connections which form the communication ring, an additional pair of signals CNFG_IN and CNFG_OUT is added. This signal is also a ring, called the configuration ring. The configuration ring propagates in the opposite direction of the communication ring. In normal operation, each module except test head interface 106 simply propagates the logic level on its CNFG_IN signal to its CNFG_OUT signal each clock cycle. Test controller CNFG_OUT is maintained continuously at a logic LOW level. Hence, the entire ring of signals connecting CNFG_IN of one module to CNFG_IN of the PREVIOUS module in the ring winds up at a LOW level after the number of clock cycles required to propagate the signal around the ring.

When test head interface 106 issues the special command DESCRIBE_CONFIGURATION(N) a different sequence of actions takes place. On issuance of this command, test head interface 106 sets a counter to 0. Every bus clock cycle afterward, this counter is incremented. The low-order 10 bits in the DESCRIBE_CONFIGURATION command contain the number N. Each module in the ring receives the command and records and decrements the number. If the result of the decrement operation is non-zero, the command is passed on through the ring. If the result is zero, however, then the command stops at that module and a serial data stream is generated by the module. The module no longer propagates CNFG_IN to CNFG_OUT. Instead, it transmits the serial data stream, one bit per clock cycle, through its CNFG_OUT pin to the previous module in the ring. This data stream is thus transmitted, module by module, back to test head interface 106. The data stream is determined by the module; however, its first bit is HIGH (which indicates to test head interface 106 the beginning of the bit stream). The next (perhaps) 12 bits specify the number of bits remaining in the data stream. The remaining bits contain information potentially useful to test controller 102 but their content is not important to this description. When the HIGH bit which begins the data stream arrives at test head interface 106, the counter stops. The content of the counter then tell exactly how many clock cycles occurred from the issuance of the DESCRIBE_CONFIGURATION command to the instrument N positions away from the test system controller. This enables the test controller 102 to determine exactly the sequence of the modules in the ring and also the exact number of clock cycles required for a communication event to propagate around the ring. With this information, the test head interface 106 calculates the time offset of each instrument from itself. Alternatively, the test controller 102 can calculate the time offset.

The final step in the configuration process is for the test head interface 106 to initialize the internal clock times for all the instruments in the ring. It does this by initializing its own internal clock register to a reasonable initial value (perhaps 1000), then issuing a sequence of commands to write the internal clock register of each module in the ring. For each module in the ring, the value written to that instrument is determined by adding to the test head interface 106 internal clock register the time offset of that module in the ring plus the time required for that module to write its internal clock register. In this way, when the internal clock register of that module is written, it will be exactly the same number as is contained in the test head interface 106 internal clock.

An advantage of this configuration process and architecture is that if the ring is broken, the test controller 102 is able to determine how many instruments can respond, where they are, and therefore where the first break in the ring occurs.

Figure 9:
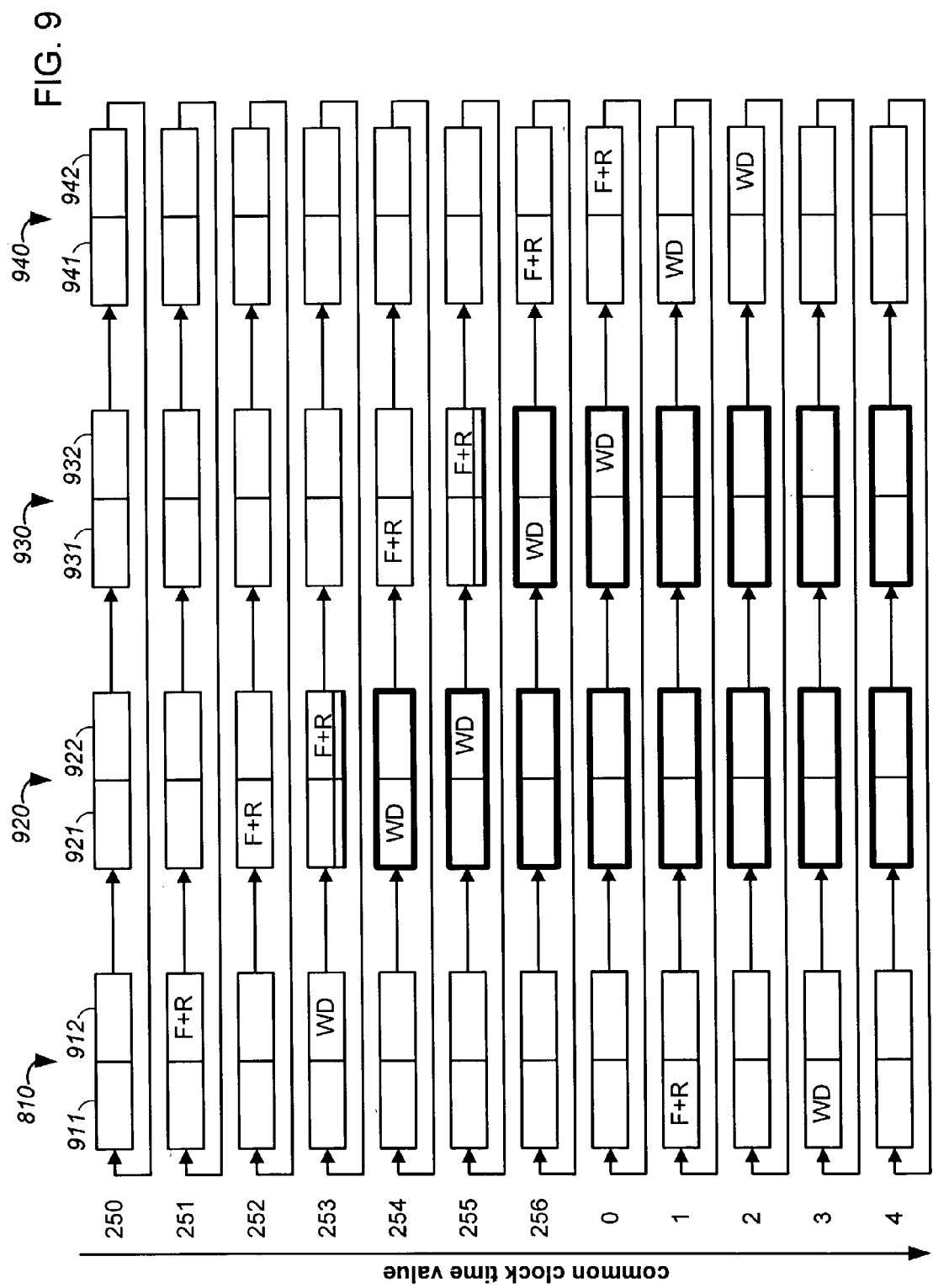
FIG. 9 illustrates a test-controller-to-module write operation.

FIG. 9 illustrates an example write operation where a test controller writes to one or more modules. In this example, the test controller is writing a data word into a first module 920 and a second module 930. The test controller 102 sends a function+resource ("F+R") word, (i.e., the control data word that includes a function-resource code) into the communication ring. This data word indicates that the test controller is writing a write data word into the first module 920 and the second module 930. The function+resource word enters the communication ring at the transmit port 912 of the test head interface 910. At the next common clock cycle, the function+resource word is transmitted to the receive port 921 of the first module 920. By the next common clock cycle, the first module 920 decodes the function+resource word that announces a write data word, waits for the write data word (denoted by a double line in FIG. 9), and moves the function+resource word to the transmit port 922. By passing the function+resource word from port to port at each common clock cycle, each module in the ring receives the function+resource word, processes (i.e., decodes) it, and sends it to the next stage. After receiving the function+resource word, a third module 940 does not wait for the write data word that is addressed to the first and second module only.

Shortly (two cycles) after transmitting the function+resource word, the test head interface 910 submits the write data word ("WD") to the communication ring at the transmit port 912. The write operation is complete when the first module 920 and the second module 930 receive the write data word (denoted by a thick frame in FIG. 9). Each of the two data words are removed from the ring as it reaches the test head interface 910.

Example of a Read Operation

Figure 10:
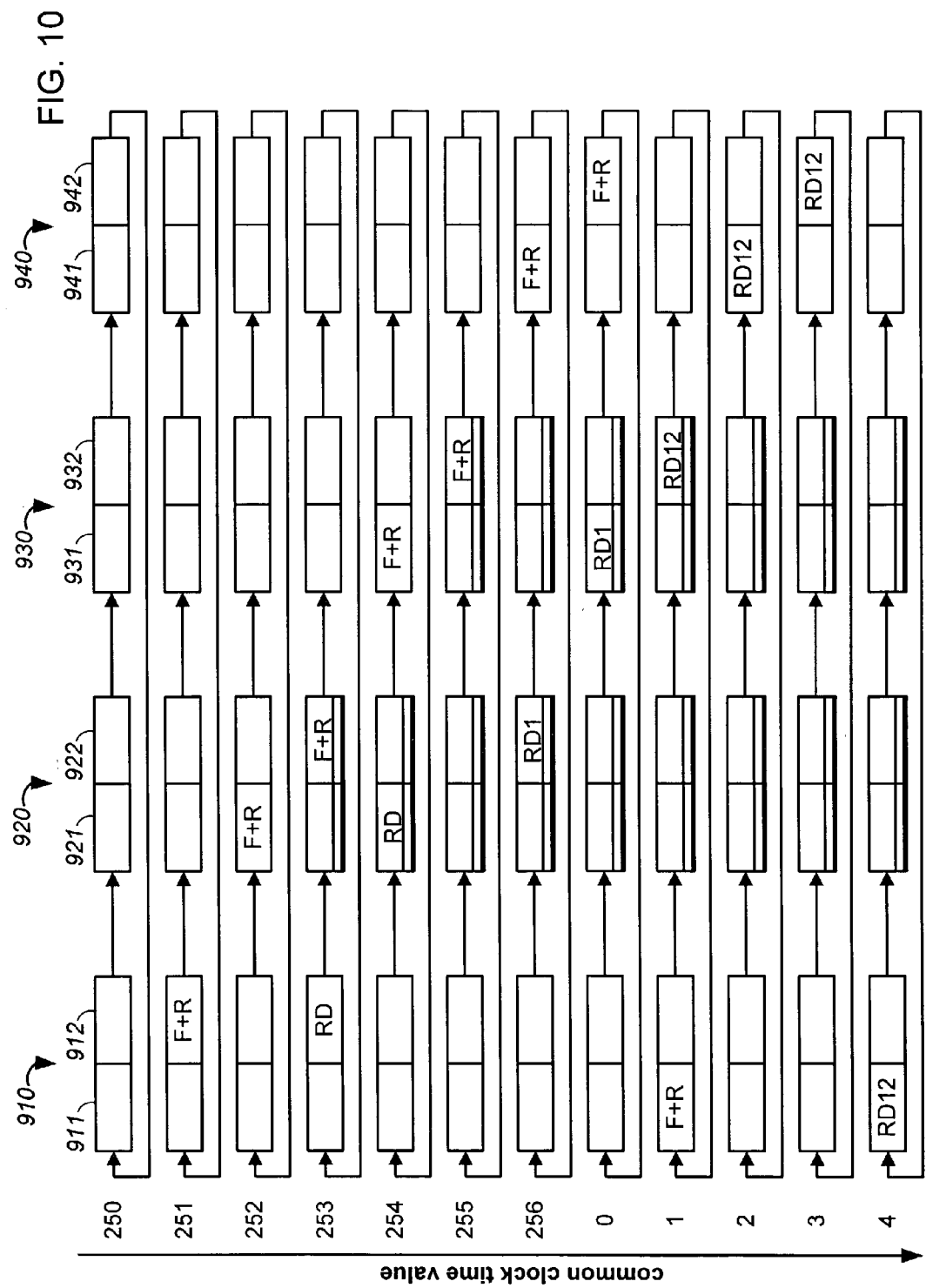
FIG. 10 illustrates a read operation where the test controller reads data stored in a module.

FIG. 10 illustrates a read operation where the test controller reads data stored in a module. In this example, the test controller is reading words from the first module 920 and the second module 930. The test controller sends a first read word request to the test head interface 910 that submits a function+resource word into the ring. Each module in the ring receives the function+resource word, processes (i.e., decodes) it, and sends it to the next stage. This data word indicates that the test controller is reading data from the first module 920 and the second module 930. After receiving the function+resource word, the first and second modules wait for read data words (denoted by a double line in FIG. 10).

Shortly (two cycles) after transmitting the function+resource word, the test head interface 910 submits a first read data word ("RD") to the communication ring at the transmit port 912. Upon receipt of the first read data word, using, e.g., an OR operation, the first and second modules add corresponding data to the first read data word (denoted by RD1 and RD12, respectively). Note that the first module 920 delays transmitting the first read data word for one common clock cycle. The test head interface removes the first read data word from the ring and transmits it to the test controller. The test controller waits until receiving the first read data word and corresponding acknowledgment before sending the second read word request.

Example of a Global Restart

Figure 11:
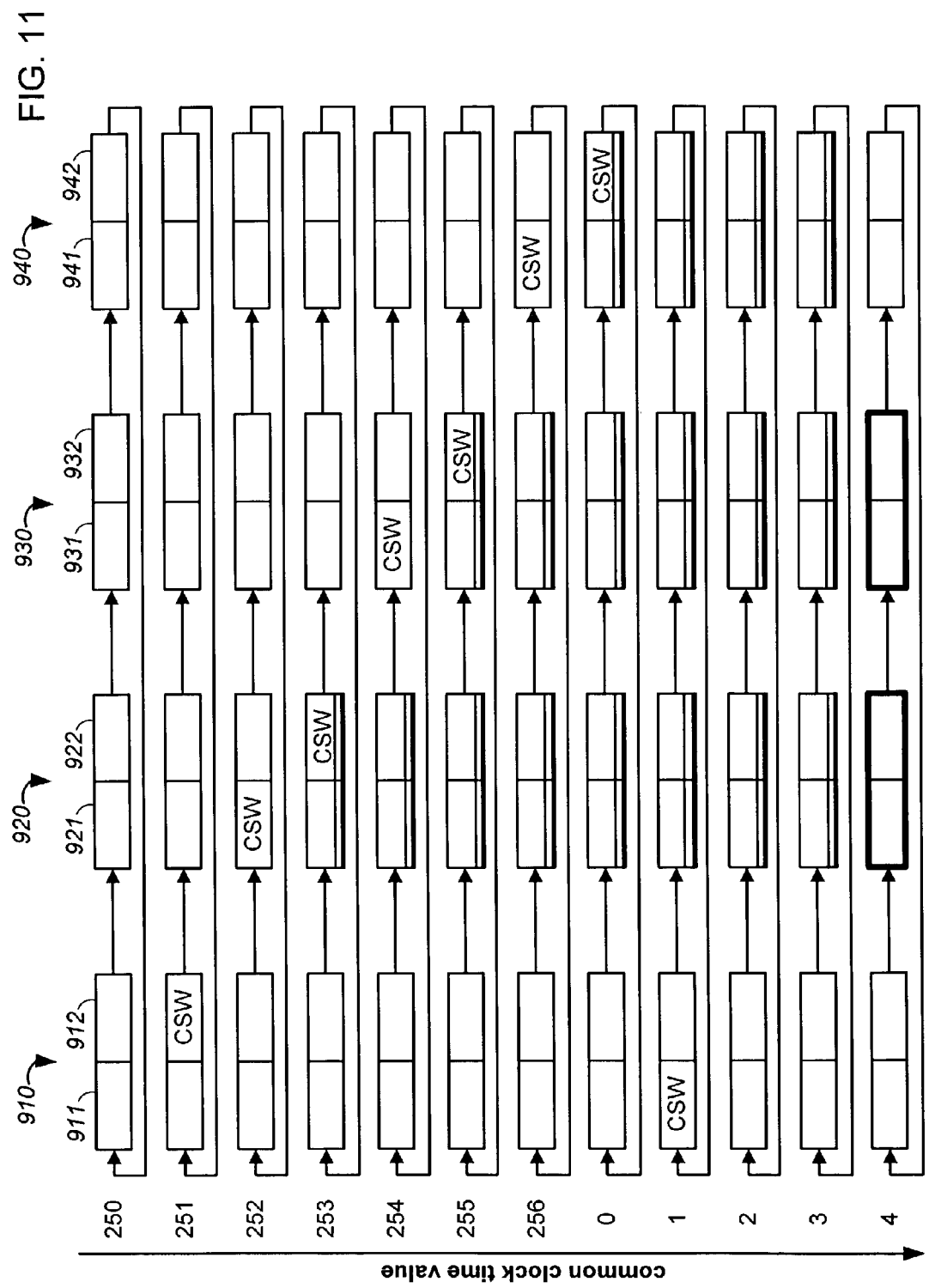
FIG. 11 illustrates a global start operation.

FIG. 11 illustrates a global start operation where the test controller schedules a test that includes one or more modules. In this example, the test controller schedules a test to be executed by the first module 920 and the second module 930. The test controller sends a confirmed sync word ("CSW") into the communication ring through the test head interface 910. This confirmed sync word indicates that the test is scheduled to start at the common clock time value 4 and involves the first and second modules. Each module in the ring receives the confirmed sync word, decodes it, schedules a trigger to the common clock time value 4 (denoted by a double line in FIG. 11), and sends the sync word to the next stage. At the scheduled common clock time value 4, the scheduled trigger starts the first and second modules to execute the test (denoted by a thick frame in FIG. 11). The scheduled trigger does not start the third module 940 to execute the test because the third module is not requested in the confirmed sync word.

Example of a Partial Sync

Figure 12:
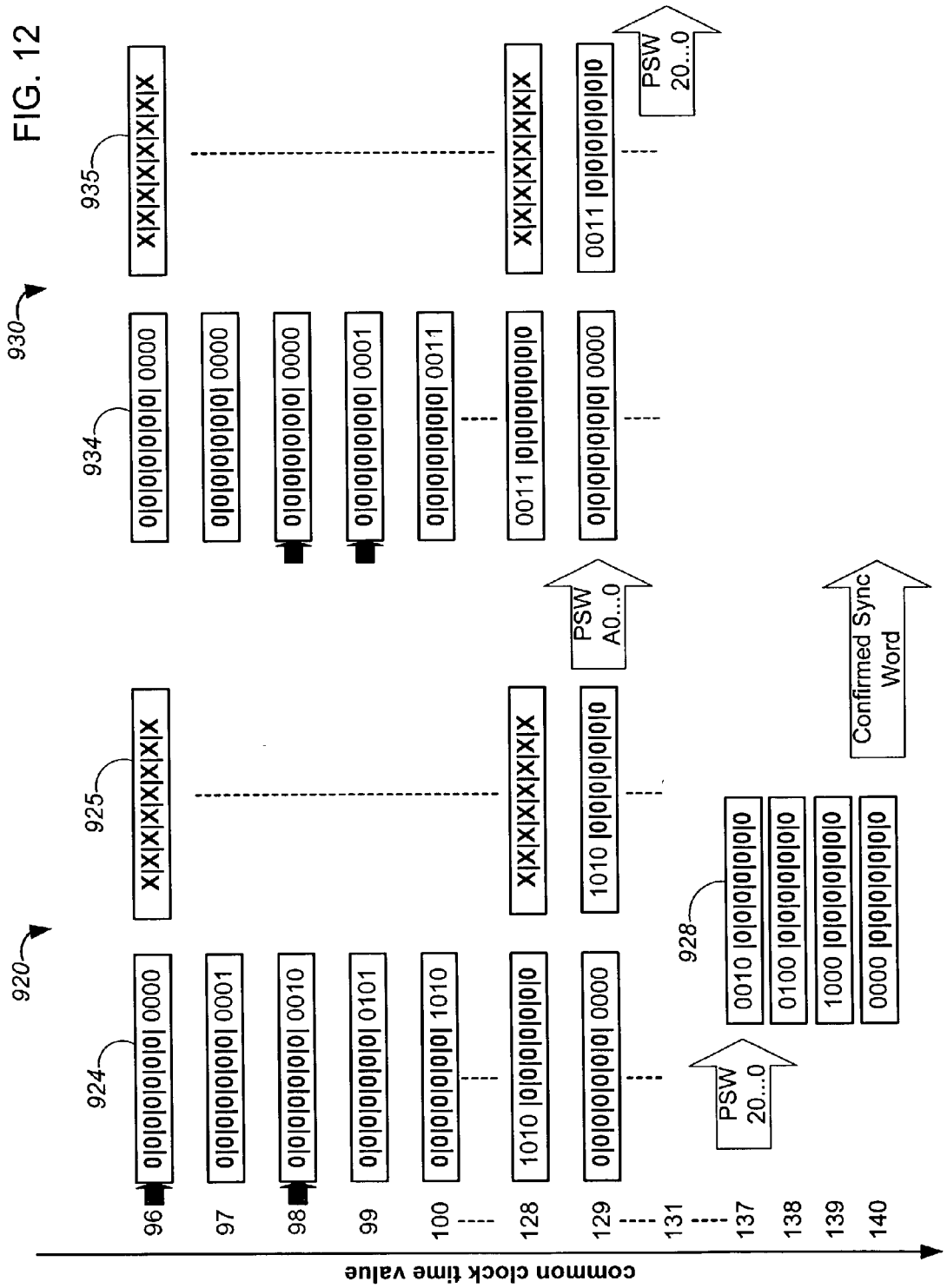
FIG. 12 illustrates a partial sync operation.

FIG. 12 illustrates a partial sync operation where two or more modules initiate a confirmed sync word. This example uses the same modules as the examples shown in FIGS. 9–11, and the first module 920 and the second module 930 initiate a confirmed sync word that, for example, schedules a start of the third module 940. To initiate the confirmed sync word, the first and the second modules first need to find a co-incident in-sync status in their state history. The first and second modules have a first register 924 and a second sync register 934, respectively. The first and second sync registers register state histories. A state history is a bit field of the in-sync status of the corresponding module for the previous 32 clock cycles. In the example, the first module has in-sync status (denoted by black arrows in FIG. 12) at common clock times 96 and 98, and the second module has in-sync status at common clock times 98 and 99. The first and second sync registers complete a first (A0000000) and second (30000000) state history, respectively, at common clock time value 128. By the next common clock cycle, the first and second state histories are transferred to a first state history register 925 and a second state history register 935, respectively.

At common clock time 129, the first module 920 inserts a partial sync word into the communication ring. The partial sync word carries the first state history. The second module 930 performs an AND operation of the first (A0000000) and the second (30000000) state histories, and forwards the result as a combined state history (20000000) through the communication ring to the first module 920. At common clock time 137, the first module removes the combined state history from the communication ring and puts it to an internal register 928. In the next common clock cycles, the first module shifts left the combined state history in the internal register 928, until a non-zero most significant bit generates the confirmed sync word to schedule the start of the third module 940. The confirmed sync word is submitted to the communication ring. The second module 930 can modify the scheduled start time in the confirmed sync word that triggers the start of the third module 940.

Implementation of the Interface Between the Test Controller and Interface Unit

The following describes an implementation in which the test controller 102 (FIG. 1) is a workstation, such as those available from Sun MicroSystems, and in which the interface unit 104 (FIG. 1) is a CPU interface board. The CPU interface board is plugged into an empty backplane slot within the workstation. The CPU interface board can include a high-performance FPGA, such as one available from Xilinx. The backplane and CPU interface board can use the 64-bit/66 MHz PCI standard, which enables a sustained transfer rate that is on the order of 240 MB/sec and a maximum theoretical transfer rate of 528 MB/sec.

System operations can be either blocking or non-blocking for the CPU interface board. A blocking operation is one that causes the CPU interface board to block the further transfer of data. A non-blocking operation is one that does not cause the CPU interface board to block further transfer of data. Write operations for monitoring test head status (i.e., test head/SM write operations) are non-blocking and, furthermore, require no acknowledgement. Write errors, such as those caused by FIFO overflow, results in an exception. Read operations for monitoring test head status (i.e., test head/SM read operations) block until the result of the read is available, subject to a programmable timeout covering at least the range of 32 µs–1 ms. In some limited cases, test head/SM read operations can optionally be deferred and non-blocking.

Implementation of the Interface Between the Interface Unit and Test Head Interface The following describes an implementation in which the interface between the interface unit 104 and the test head interface 106 is a serial link that runs at approximately 3 Gbytes/sec. The test head interface 106 can be a board that includes a FPGA and a serialize/deserialize ("SerDes") device to convert the serial data from the interface unit 104 to parallel data readable by the FPGA. An example of a SerDes device that can be used here is the TLK3101 available from Texas Instruments, which device, among other capabilities, can transform serial data to 16 bit words. In order to send data efficiently, the 16 bit words is divided into 4 bit nibbles. Each system operation can be described by one or more nibbles. One operation, thus, can be encoded over multiple or partial 16 bit words from the SerDes device.

When there is no recovery protocols implemented for errors that may occur over the link, additional forward error correction may be necessary to ensure that the link operates reliably. A detected residual error, for example, can be flagged to the test controller 102 as an alarm.

The following provides examples of downlink words, which include words sent from the test controller 102, through the interface unit 104, and over the serial link to the test head interface 106. One example is the empty word shown in FIG. 13A. As discussed above, a system operation can be encoded in less than 16 bits. In these cases, empty words are used as padding by the interface unit 104 to ensure that a last operation is transmitted completely when there have been no additional messages received. Another example of a downlink word is the read word shown in FIG. 13B. After it sends a read word, the test controller waits for a response (i.e., a read word sent from the test head interface 106) before sending any other instructions. Yet another example of a downlink word is the DMA word shown in FIG. 13C. The interface unit 104 can send a special read command that includes a count for DMA transfers. This capability reduces the number of commands sent from the interface unit 104 to the test head interface 104, which reduction lowers the required memory register (i.e., FIFO size) of the FPGA. An additional benefit is that the test head interface 104 can better control data flow on the serial communication ring 114. Other example of downlink words are the abort DMA transfer word shown in FIG. 13D, the write word shown in FIG. 13E, the resource/function word shown in FIG. 13F, and the SM write word shown in FIG. 13G. The abort DMA transfer word aborts a DMA read currently in progress. The formats of the resource and function fields of the resource/function word are further described below, as are those of the data fields of the SM write words. The 0xFE slot of the SM write word is used to address a specific group of instruments at once. The group can be defined by using normal write operations sent from the test controller to the test head interface.

The following provides examples of uplink words, which include words sent from the test head interface 106 to the interface unit 104. The empty word and read word described above are examples of uplink words. The test head interface 106 sends a read word in response to receiving a write word from the interface unit 104. It is this read word that the interface unit 104 waits for after it sends the initiating write word. The test head interface can include a feature, based on the read of specific function codes, to translate the format of the read data. This feature is used to convert the read back of captured analog samples from either analog or digital instruments. Another uplink word is the SM read word shown in FIG. 13H, which word can be generated by either the instruments or the test head interface 106. The test head interface 106 can process some of the SM words generated by the instruments. In these cases, the test head interface does not pass the SM read word to the interface unit 104. The format of the data field for the SM read word is further described below. Other uplink words are the sync word shown in FIG. 13I, the flow control word shown in FIG. 13J, and the DMA abort confirmed word shown in FIG. 13K. Additional uplink words are shown in Table 2.

TABLE 2

| bit 7 | bit 6 | bit 5 | bit 4 | bit 3 | bit 2 | bit 1 | bit 0 | Meaning | Notes |
|---|---|---|---|---|---|---|---|---|---|
| 1 | 0 | 0 | 0 | 0 | 1 | 0 | 1 | SM over flow | From module to test head interface |
| 1 | 0 | 0 | 0 | 0 | 1 | 1 | 0 | Serial bus fault | From test controller to test head interface |

Sync words generated by the instruments are sent to the interface unit 104 for debug and test flow control purposes. The test head interface 106 uses flow control word as described above to avoid overflow of its FIFO register. The test head interface 106 sends the DMA abort confirm word to the interface unit 104 in response to receiving an abort DMA transfer. After it receives a DMA abort word, the test head interface 106 waits until all pending read data has been flushed from the serial communication ring 114 before sending the DMA abort confirm word.

Implementation of the SM Interface

The following describes an implementation of the SM interface which includes two unidirectional high speed serial links connect the interface unit 104 with the test head interface 106 and three signal wires connect the test head interface and each module.

The SM interface is independent of the daisy-chained bus and must be able to function even when the daisy-chained bus is not operational. The SM interface has the following high-level functions:

Reporting of temperature, power or other system fault condition

Controlled power-down and power-up of instruments

FPGA download

EEPROM access

System hard reset

Passing of slot ID

Each instrument is linked to the test head interface 106, which concentrates and buffers the information. The test head interface has a link to the interface unit 104 to generate fault interrupts. A module should have at least three signal paths for transmitting data, ground, and receiving data.

Alternatively, the SM interface can be that of the communication ring. That is, the test system can use the same communication through which it sends control data words to also send SM words.

Implementations of the Module

Figure 14:
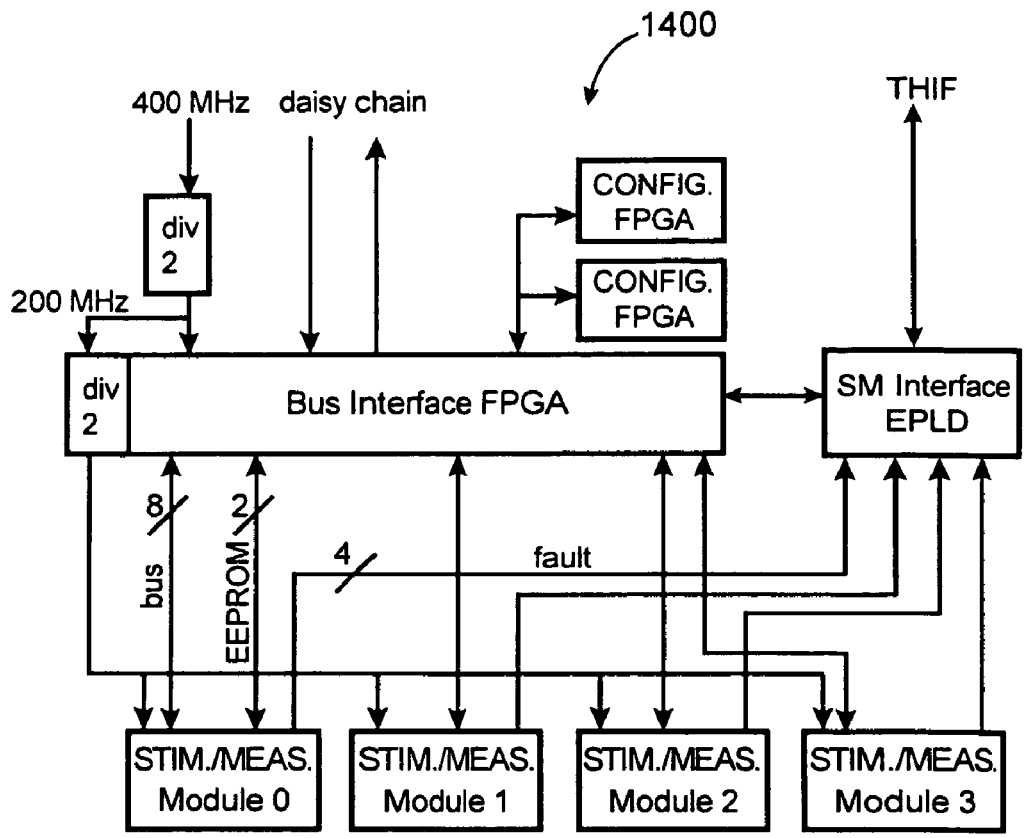
FIG. 14 shows an implementation of the module 200.

FIG. 14 shows one implementation in which module 200 is a pin slice module 1400. This implementation is a test instrument module which incorporates one or more stimulus/measurement modules, such as PE modules, TMU modules, and PMU modules. Each of these stimulus/measurement modules has specific stimulus or measurement tasks required of it, and these specific tasks are scheduled by commands synchronized by the combination of the system master clock and the instrument internal time counter register. A dedicated bus connects the bus interface FPGA ("bus FPGA") to the one or more stimulus or measurement modules contained within the instrument. Module control data are transferred to the stimulus/measurement modules, and data to be read from the stimulus/measurement modules are transferred from them at the rising edge of 100 MHz Clock, with a maximum of one transfer on every cycle.

In this implementation, there are 37 signals:

32-bit bidirectional data, inverted on read 3-bit cycle type, CYC

BUSY: 0=hold off further cycles, 1=normal operation.

The data bus and BUSY adheres to the gunning transceiver logic plus ("GTLP") standard (open collector), with pull-ups to 3v3. CYC is a stub-series terminated logic ("SSTL") and is driven by the bus FPGA. The data transfer acknowledgement ("DTACK") from one of the configured FPGA connects to both the bus FPGA and the other configured FPGA and is a low voltage transistor-transistor logic ("LVTTL"). Table 3 shows examples of CYC codes.

TABLE 3

| CYC | Meaning | DTACK | Data Bus |
| --- | --- | --- | --- |
| 0 | Write | Used | Driven by bus FPGA |
| 1 | Read | Used | Driven by configured FPGA |
| 2 | Function | Used | Driven by configured FPGA |
| 3 | No operation | Ignored | Driven by bus FPGA |
| 4 | Resource, bits 0–31 | Ignored | Driven by bus FPGA (junk data) |
| 5 | Resource, bits 32–63 | Ignored | Driven by bus FPGA |
| 6 | Resource, bits 64–95 | Ignored | Driven by bus FPGA |
| 7 | Resource, bits 96–127 | Ignored | Driven by bus FPGA |

Function or resource cycles, in this implementation, always take one clock cycle. They cannot be extended with DTACK. Read and write cycles are extended if either/both configured FPGA assert DTACK. The cycle completes when DTACK is not asserted at the next rising edge of 100 MHz. Both configured FPGA will need to monitor DTACK to determine when a new cycle is beginning. It cannot be assumed that any change to CYC will occur.

The bus FPGA sends data in normal polarity in all cases except for read cycles. In that case, the FPGA's outputs are tri-stated, and the two configured FPGA wire-AND inverted read back data1. This gives the OR'ing mechanism required. Each configured FPGA also includes a mapper, allowing the read back bits to be scrambled.

During a function cycle, the least significant 16 bits are the current function code, with the base address already subtracted, so they begin at zero. Page 0 functions are not sent to the configured FPGAs. The most significant 16 bits are the current resource number, coded as it is on the system bus.

If G=0 in the resource code (i.e., bit 31=0), a single channel is being addressed, and the resource mask set by cycle types 4–7 is not required and shall be ignored. If G=1, the remaining resource bits in the function cycle (i.e., bits 30–16) must be ignored. Instead, the resources being addressed are defined by a mask. This mask is written by cycles types 4–7, which may occur before or after the function cycle. Using these cycles, up to 128 resources may be addressed in any combination. For bandwidth efficiency, CYC=4 is defined to clear mask bits 32–127, and thus will be written before cycles 5–7, which may not be needed at all. Each configured FPGA will need to know, e.g., through a pin, whether it is to decode high-order or low-order resources.

Sync type and time information passes between the configured FPGAs and the bus FPGA on every 200 MHz clock. All signals are SSTL.

The following describes one implementation of a request of a confirmed sync. Eighteen bits are passed from a configured FPGA to the FPGA to request a confirmed sync. The 18 bits consist of 12 bits of time, with a resolution of approximately 1.22 ps (i.e., 5 ns/4096), plus a 6 bit sync type code. A sync type of zero indicates that this clock cycle does not contain a sync.

Alternatively, for low accuracy triggers, the 12 bit time field may be coded with 6 MSBs of time, and 6 bits of subtype. Time information reflects the user time, T0, of the generating vector. The bus FPGA includes a feature to map sync types and/or subtypes, allowing test patterns to be site independent. This mapping may be subject to limits, but at least 64 syncs per configured FPGA will be allowed for.

The following describes a request of a partial sync. One bit passes from the configured FPGA to the bus FPGA to request a partial sync. The bit should be a logical high for the duration of the in-sync condition. Any 200 MHz clock cycle is marked in-sync if the sync condition became asserted during that cycle, and/or remained asserted at the end of the cycle.

Except for fail, any facility the configured FPGA may have for generating syncs (e.g., opcodes, EINST bit, match) can be configurable as either a partial or a confirmed sync request. Fail need only be configurable as a confirmed sync. The two request mechanisms should be able to function independently, allowing for concurrent generation of different syncs.

The following describes one usage of a confirmed sync. Eighteen bits are passed from the FPGA to the configured FPGA to indicate that a confirmed sync has occurred. They are prioritized statically to deal with simultaneous occurrence. These bits have the same format described above. The configured FPGA will have the ability to use the confirmed sync time information in two ways for general purpose syncs (i.e., those not being used for a specific purpose, such as test program start, stop or fail):

To determine which vector contained the sync, and act accordingly, but maintaining the test-program-defined vector periods.

To shift the program timing based on the exact time of the sync, such that the following vectors are precisely offset from the sync event by a fixed latency. Provided the sync generation is also asynchronous, this offset is independent of vector periods.

Furthermore, the configured FPGA can either ignore syncs that occur before the opcode that will wait for them, or can treat the condition as having been immediately met. The configuration for this and the two modes of interpretation can be implemented with different opcodes, or with static configuration according to sync type. The configured FPGA need not be aware of subtypes in sync usage because of the mapping mechanism.

The bus FPGA includes a feature to map sync types and/or subtypes, allowing test patterns to be site independent. This mapping may be subject to limits, but at least 64 syncs per configured FPGA will be allowed for. The configured FPGA also needs a least-common-denominator type counter to allow sync recognition to be deferred until a suitable point.

Figure 15:
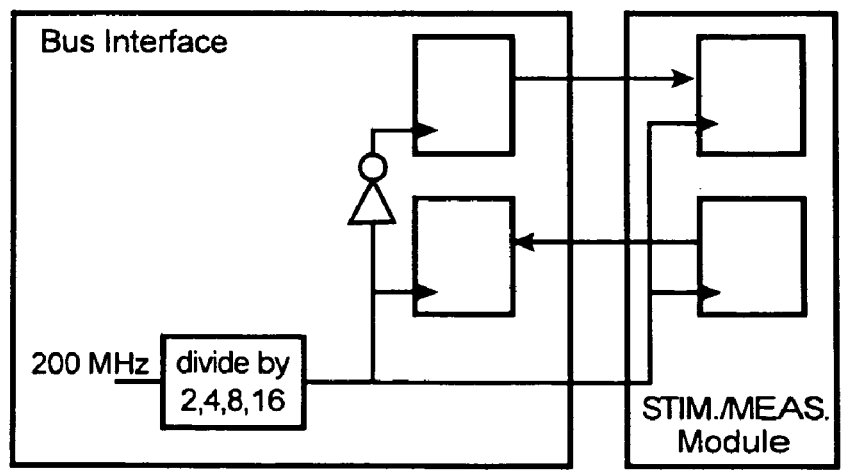
FIG. 15 shows one implementation of links between the BUS FPGA and a PE module.

FIG. 15 shows an implementation of the bus FPGA interface with the stimulus/measurement modules, such as a PE module, a PMU modules, and a TMU module, that can be included in the pin slice module 1400. In this implementation, there are four such modules. The physical link is a pair of nibble-wide unidirectional serial streams clocked at 12.5, 25, 50 or 100 MHz. A total of 10 connector pins (excluding grounds) are used. The typical transport rate for this implementation is 40 Mbytes/sec.

All nine signals are single-ended, LVTTL compatible, with 50W series termination, except for the clock which is low voltage differential signaling ("LVDS"). All 8 data are point-to-point between the bus interface FPGA on the motherboard and the FPGA/EPLD (erasable programmable logic device) on the PE modules.

The bus FPGA generates the clock, which is programmable (12.5, 25, 50 or 100 MHz) per interface. The default is 12.5 MHz. Clock inversion is used to ensure optimal timing.

Each module on a pinslice (e.g., the PE, TMU or PMU) has an independent link. The bus interface FPGA is responsible for OR'ing together data read from multiple modules in response to a single read operation.

The following describes down linking for the implementation. Data is transferred in 4 bit nibbles, or a series of nibbles, as follows:

0x0: padding. Ignored.
0x4: data read. Response is on uplink.
0x5+8N: data write with 32 bits of data, LS4b first.
0x7+4N: function write with 16 bits of function code.
0x8+1N: resource write with 4 pre-decoded address bits.
0x9+2N: resource write with 8 pre-decoded address bits.
0xA+4N: resource write with 16 pre-decoded address bits.
0xB+8N: resource write with 32 pre-decoded address bits.
0xF: reset. A minimum of 9 are sent in succession.
others: for future expansion.

Data transfers are always 32 bits. The resource word is pre-decoded by the bus FPGA. Each bit corresponds with a pin, to a maximum of 32 per PE module. If a bit is set, that pin is being addressed. Multiple pins may be addressed simultaneously. The PE modules are not expected to perform participate decode—that function is managed by the bus interface FPGA. If a resource write contains fewer bits than the maximum resource count for that module, the upper bits are presumed to be zero. A PE module is not required to handle resource writes of larger size than legitimate.

Because of the pre-decoded resource word, no form of slot or module ID signals need to be passed to the module to aid decoding. The bus FPGA can filter useless bus transactions—i.e., those corresponding to resources or functions not decoded by a PE module. The bus FPGA manages a FIFO queue of bus transactions for the PE modules.

The following describes uplinking in the implementation. Padding nibbles are transmitted on the downlink following a data read until all 8 nibbles from the read have been received on the uplink. A reset on the downlink (0xF) aborts the read. The uplink carries padding nibbles (0x0) most of the time. Only when there is valid data in response to a read on the downlink is data transported. In this case, a 0x4 nibble is followed by 8 data nibbles, LS4b first.

A flow control mechanism is also defined, to allow the PE module to hold up additional transmissions from the bus FPGA, e.g., to allow slow register writes to complete. The PE module does not need to implement this mechanism if it can support operation at the maximum transfer rate.

An uplink nibble of 0xC tells the bus FPGA to continue the current transmission (if any) but then to hold off additional transmissions until an uplink nibble of 0xD is sent. During hold off, padding nibbles (0x0) are sent on the downlink. The only exception is that a reset (0xF) on the downlink restores normal operation. The uplink data bits are pulled high, so the bus FPGA can detect a missing module by the 0xF code it will see.

For FPGA downloads, there is a 5-wire standard JTAG bus that is routed to every PE module. This can be used for FPGA download as well as debug functions, if needed. Alternatively, instruments can adopt other FPGA download schemes. Dedicated Xilinx signals (such as DIN and PROG) are not provided, because of the need to support other FPGA vendors. To save bus interface FPGA pins, the 3 common JTAG control signals can be routed in parallel to all four PE modules. However, the TDI and TDO lines are unique.

Every PE module includes an EEPROM, which is needed for determining the module type. The EEPROM is usually accessed prior to FPGA download, because the contents will determine the configuration. There are two connector pins, both being LVTTL compatible. The are for PROM clock and PROM data. The data line is bidirectional open collector, pulled up by the motherboard. To save bus interface FPGA pins, the EEPROM clock signal can be routed in parallel to all four PE modules. However, the data line is unique.

Figure 16:
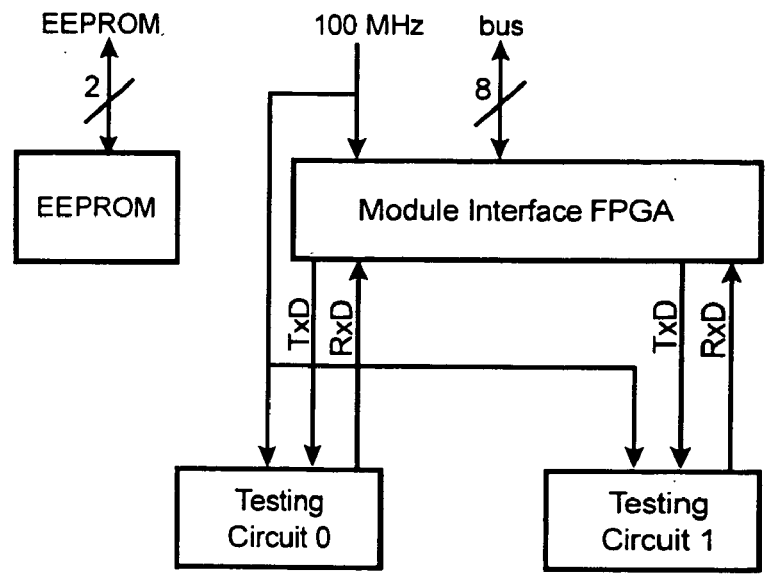
FIG. 16 shows an implementation of a communication interface inside a PE, TMU, or PMU module.

FIG. 16 shows an implementation in which each of the stimulus/measurement modules includes a module interface FPGA and one or more testing circuits configured to generate event sequences for testing signals that implement an event sequencer testing capability described in commonly owned U.S. Pat. Nos. 5,477,139 and 5,212,443. In this implementation, each testing circuit includes an independent serial interface, with three LVTTL pins:

100 MHz clock
TxD (transmit data)—serial data from the module interface FPGA to the second type of configured FPGA (downlink)
RxD (receive data)—serial data from the testing circuit to the module interface FPGA (uplink)

The idle state of TxD and RxD is a high. All TxD messages begin with a single zero bit, followed by a two bit message type, followed by a variable length payload. LSB is transmitted first. Idle state is not required between messages. RxD is the same, except it is only used for read back, so there is no message type. Table 4 shows examples of message types for the second type of configured FPGA

TABLE 4

| Type | Payload length | Meaning | TxD? | RxD? |
|---|---|---|---|---|
| 0 | 0 | Perform read | Yes | No |
| 1 | 31 bits | Write data | Yes | No |
| 2 | 16 bits | Resource, decode mask | Yes | No |
| 3 | 16 bits | Function, based at zero | Yes | No |
| N/a | 32 bits | Read data | No | Yes |

TxD message type 0 (read data) requires that the testing circuit respond on RxD with the required data. The testing circuit can take some time to respond, and until it does no further messages are sent. The PE module FPGA is responsible for OR'ing together data read from multiple testing circuits in response to a single read operation.

Figure 17:
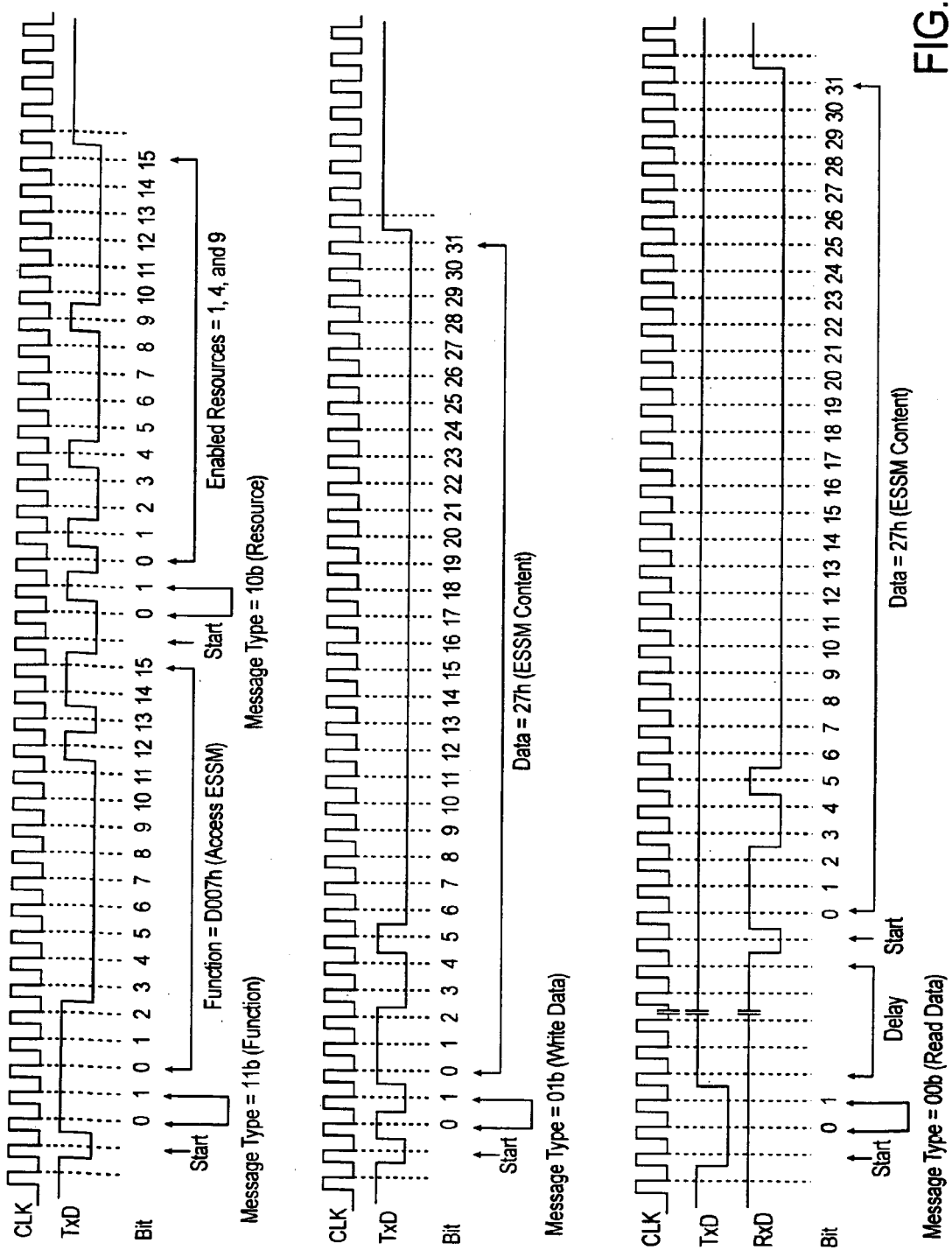
FIG. 17 shows examples of function, resource, write, and read messages.

The 16 bit resource mask has 1 bit for each of up to 16 addressable resources per testing circuit. If the bit is set, that resource is being addressed. The bits may be set in any combination, to implement participate—this is handled by the bus FPGA. Nothing apart from testing circuit need be aware of the current MUX mode, because the resource code used by software will be the first resource allocated to the pin in the current mode, e.g., in a 4-to-1 mode, the s/w will address resources 0, 4, 8, etc. The 16-bit mask implied by this can be interpreted by the testing circuit as necessary given the current mode. FIG. 17 provides examples of function, resource, write, and read messages used in this implementation.

Figure 18:
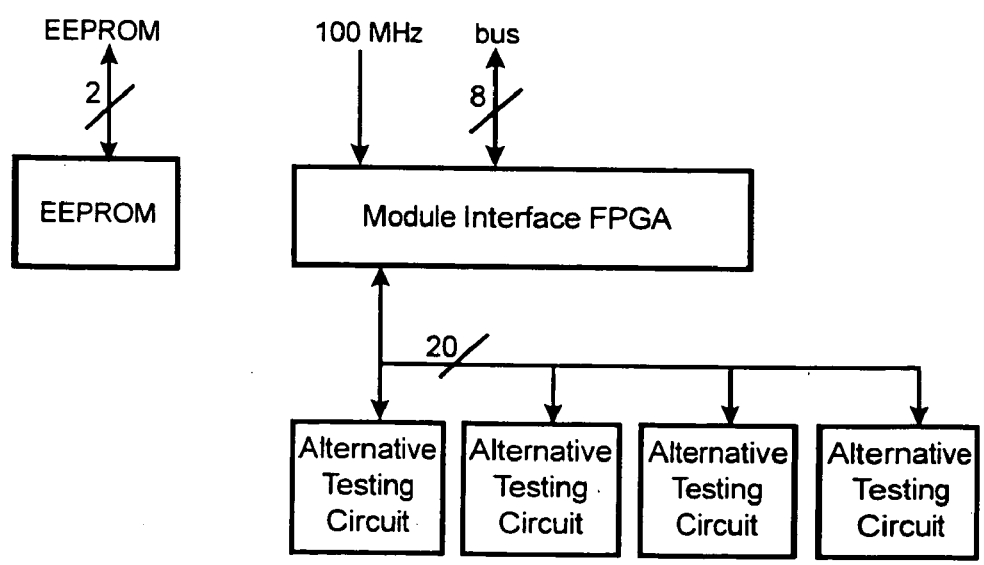
FIG. 18 shows another implementation of the communication interface inside a PE, TMU, or PMU module.

FIG. 18 shows an implementation in which one of the stimulus/measurement module includes an alternative testing circuit. There are 20 ECL compatible signals:

TxC, clocks transfers
UWORD: 0/1 for LS/MS 16 bits of a 32-bit transfer
S0,S1: encodes cycle types
D0–15: bidirectional data bus, wire-OR'd Timing and protocols can be compatible the alternative testing circuit devices. Because participate decode is now being managed by the BUSIF, participate memory within the alternative testing circuit devices is not used.

The following describes one implementation of an interface between the module bus and SM FPGAs. A slow speed serial link exists between these two devices on the instrument motherboard. This is used to:

Inform the bus FPGA of its slot ID for resource decoding purposes
Reset the instrument
Signal fault information back to the SM system Not included in this section are the signals the SM FPGA must generate to program the bus FPGA. These signals are vendor-specific and do not require standardization. For efficient design re-use, and to reduce the number of optocouplers needed, a two wire (TxD+RxD) scheme is used, identical to that specified in section 5.3.

The downlink (SM EPLD to bus FPGA) byte is the programmed slot ID and is written whenever the SM EPLD receives it. The only exceptions are: 0xFF is not to be interpreted as a slot ID, but instead as a global reset. This also retransmits any pending faults, as described below. 0xFE requests the bus FPGA to retransmit any current fault conditions, if any. Normally faults are only transmitted once, and silently clear. The uplink (bus FPGA to SM EPLD) byte is encoded with fault codes, in the exact format defined by section 5.5. No transmission takes place unless there is a fault.

Figure 19:
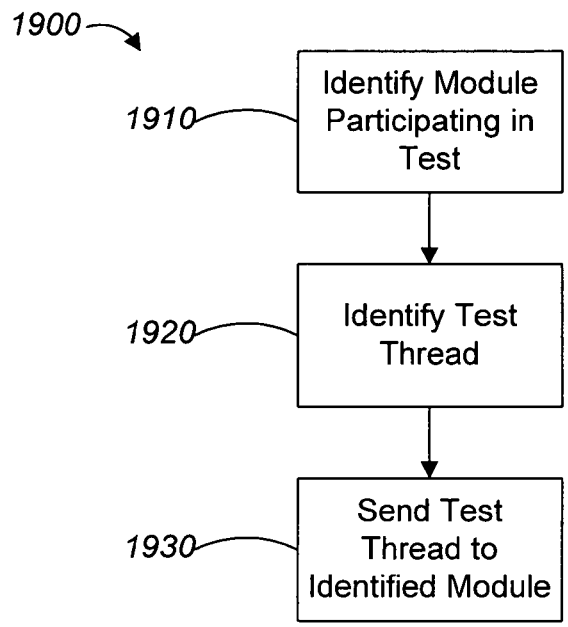
FIG. 19 shows a process for controlling one or more modules according to a test process.

FIG. 19 shows a process 1900 for controlling one or more modules that are configured to test one or more integrated circuits according to a test process. At least one of the modules that are participating in the test process is identified (step 1910). A test thread is identified (step 1920) among independent test threads, where the test thread includes instructions for generating data words to be sent to other modules, and the test thread is sent to the identified module (step 1930).

Figure 20:
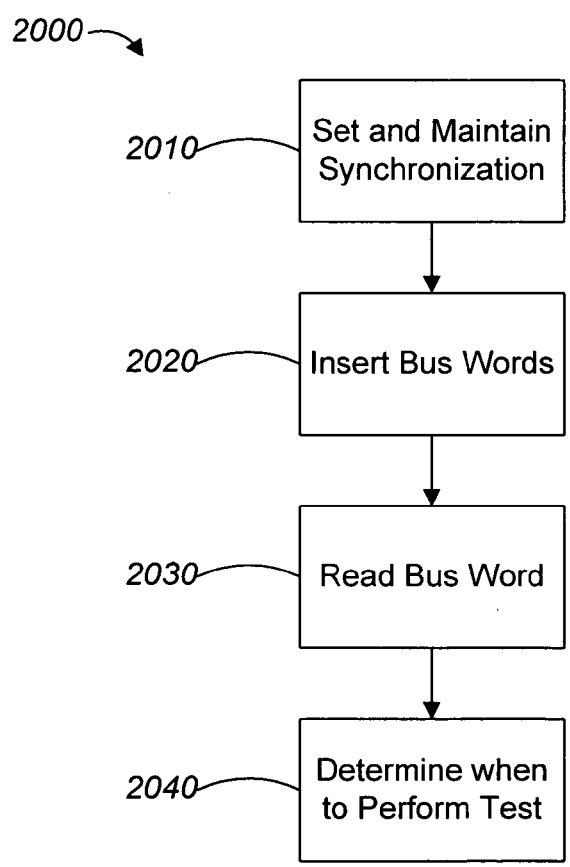
FIG. 20 shows a process for controlling and synchronizing one or more test instruments to test an electrical circuit.

FIG. 20 shows a process 2000 for controlling and synchronizing one or more test instruments to test an electrical circuit, where the test instruments are connected in a communication ring. Synchronization of an internal time register of each test instrument is set and maintained to a common clock cycle (step 2010) by using a global clock signal of a master clock. The common clock cycle provides common clock time values for scheduling test events. Bus words are inserted into the communication ring (step 2020) to carry the bus words to each of the test instruments. The inserted bus words include at least one bus word specifying a scheduled common clock time value for performing a test event by a target test instrument. The bus word specifying a scheduled common clock time value is read by the target test instrument (step 2030), and the scheduled common clock time value and the common clock cycle in the internal time register of the target test instrument are used to determine when to perform the test event (step 2040).

The methods and apparatus described herein can be implemented in digital electronic circuitry, or in computer hardware, firmware, software, or in combinations of them. These methods and apparatus can be implemented as a computer program product, i.e., a computer program tangibly embodied in an information carrier, e.g., in a machine-readable storage device or in a propagated signal, for execution by, or to control the operation of, data processing apparatus, e.g., a programmable processor, a computer, or multiple computers. A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Method steps can be performed by one or more programmable processors executing a computer program to perform functions described herein by operating on input data and generating output. Method steps can also be performed by, and apparatus described herein can be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for executing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. Information carriers suitable for embodying computer program instructions and data include all forms of non-volatile memory, including by way of example semiconductor memory devices, e.g., EPROM, EEPROM, and flash memory devices; magnetic disks such as internal hard disks and removable disks; magneto-optical disks; and CD-ROM and DVD-ROM disks. The processor and the memory can be supplemented by, or incorporated in special purpose logic circuitry.

The methods and apparatus has been described in terms of particular embodiments. Other embodiments are within the scope of the following claims. For example, the described steps can be performed in a different order and still achieve desirable results. Devices for adapting off-the-shelf instruments can be included in the test head or, alternatively, in each module. The modules can have any architecture that supports data exchange through a communication ring and is not limited to the implementations described. The test system can convey status monitoring words through a channel that is separate from the communication ring or, alternatively, can convey such words through the communication ring.

What is claimed is:

1. A system for controlling test instruments that are configured to test one or more integrated circuits, the system comprising:

a master clock directly connected to each of two or more test instruments, the master clock being configured to provide a master clock signal to the two or more test instruments, the two or more test instruments being connected to form a communication ring, each of the two or more test instruments including an input port and an output port, the output port of a first test instrument being connected only to the input port of a second test instrument, a data word provided to the input port of the first test instrument being provided to the input port of the second test instrument only by the output port of the first test instrument; and a controller connected to the communication ring, the controller being configured to align counters of the two or more test instruments to derive a common clock time value from the master clock signal, the controller being further configured to generate and send data words into the communication ring to carry the data words to each of the two or more test instruments, the data words including at least one data word specifying a test event to be performed, a common clock time value, and at least one of the two or more test instruments, wherein the at least one of the two or more test instruments is configured to perform the test event at the time specified by the common clock time value.

2. The system of claim 1, wherein:
at least one of the two or more test instruments can delay a data word carried by the communication ring without coordinating the delay with any other test instrument.

3. The system of claim 2, wherein:
at least one of the two or more test instruments can replace a bus word carried in the communication ring with a delayed bus word.

4. The system of claim 1, further comprising:
an adaptor for converting one of the two or more test instruments into a module, the adaptor including a processor, memory, and a data bus that is configured for connecting the processor and memory to the communication ring and, furthermore, for exchanging data with one or more of the two or more test instruments.

5. The system of claim 4, wherein the one test instrument of the two or more test instruments converted into a module comprises an off-the-shelf test instrument.

6. The system of claim 1, wherein:
at least one of the two or more test instruments is constructed as a module.

7. The system of claim 1, further comprising:
a first adaptor and a second adaptor, each adaptor for converting the first and second test instruments into modules, the first adaptor including a processor and logic to insert a partial sync word into the communication ring, the second adaptor including a processor and logic to add synchronization information to the partial sync word and to return the partial sync word to the first adaptor.

8. The system of claim 7, wherein the synchronization information added to the partial sync word includes a state history of the second test instrument.

9. The system of claim 1, wherein the controller is configured to insert control data words into the communication ring, the control data words carrying test function information to a test instrument of the two or more test instruments.

10. The system of claim 1, wherein the controller is configured to insert a read data word into the communication ring, the read data word requesting measured test data from a test instrument.

11. The system of claim 1, wherein the communication ring carries bus words in a daisy chain fashion from the output port of each of the two or more test instruments to the input port of an adjacent test instrument.

12. The system of claim 1, wherein the data words include an address specifying at least one target test instrument.

13. The system of claim 1, wherein the controller is configured to insert bus words into the communication ring through a test head interface.

14. The system of claim 1, wherein the controller is configured to insert data words that include information for testing a second integrated circuit into the communication ring, the inserting occurring during a testing of a first integrated circuit.

15. The system of claim 1, further comprising:
status monitoring devices for receiving reports from each of the two or more test instruments, a report of a test instrument specifying the status and capability of the test instrument.

16. The system of claim 15, further comprising:
a status monitoring link separate from the communication ring.

17. The system of claim 15, wherein:
the reports comprise data words exchanged between the controller and the two or more test instruments over the communication ring.

18. The system of claim 1, wherein:
the first test instrument comprises a first processor and logic configured to insert into the communication ring a data word that comprises information describing a first test event, and
the second test instrument comprises a second processor and logic configured to add to the data word information describing a second test event.

19. The system of claim 18, wherein:
the information describing the first test event comprises information acquired by the first test instrument; and
the information describing the second test event comprises information acquired by the second test instrument.

20. The system of claim 19, wherein:
the controller processes the data word.

21. The system of claim 19, wherein:
at least one of the two or more test instruments processes the data word.

22. The system of claim 18, wherein:
the data word comprises information that specify a common clock time value and a test event that occurred at the common clock time value.

23. A data and control signal distribution subsystem for an automatic circuit test system having test instruments for performing tests on a electrical circuit, the subsystem comprising:
a communication ring for coupling test instruments in the system to each other in a daisy chain fashion, where the communication ring is configured to connect to each test instrument through a single input port and a single output port;
a master clock circuit providing a master clock signal; and
a dedicated clock signal path between each test instrument in the test system and the master clock circuit, the dedicated clock signal paths together distributing the master clock signal to all test instruments in parallel;
wherein the communication ring is the exclusive path for test instruments in the test system to send synchronization signals and command signals to one another during a performance of a test, and the master clock signal received through a dedicated signal path is the exclusive global clock signal provided to test instruments in the test system.

24. The subsystem of claim 23, further comprising:
an adaptor for converting one of the test instruments into a module, the adaptor including a processor, memory, and a data bus that is configured for connecting the processor and memory to the communication ring and, furthermore, for exchanging data with one or more of the test instruments.

25. The subsystem of claim 23, further comprising:
a first adaptor for converting a first test instrument into a module, the first adaptor including a processor and logic to insert a partial sync word into the communication ring; and
a second adaptor for converting a second test instrument into a module, the second adaptor including a processor and logic to add synchronization information to the partial sync word and to return the partial sync word to the first adaptor.

26. The subsystem of claim 23, further comprising:
status monitoring devices for receiving reports from each of the test instruments, a report of a test instrument specifying the status and capability of the test instrument.

27. A computer program product, tangibly stored on machine-readable medium, for controlling one or more test instrument modules that are configured to test one or more integrated circuits in accordance with a test process, the product comprising instructions to cause a test system to:
identify a first test instrument module of the one or more test instrument modules that are configured to test integrated circuits in accordance with a test process, a test instrument module being a test instrument implemented as a module and including testing circuitry;
identify an independent test thread for the first test instrument module, the test thread comprising instructions for generating data words to be sent to another of the test instrument modules; and
send the test thread to the first test instrument module.

28. The computer program product of claim 27, further comprising instructions to:
align counters of the one or more test instrument modules to a common clock cycle.

29. The computer program product of claim 28, further comprising instructions to:
generate a data word that specifies, a test event, a particular common clock cycle, and one or more of the test instrument modules to perform the specified test event at the common clock cycle.

30. A method for controlling and synchronizing one or more test instruments connected in a communication ring to test an electrical circuit, the method comprising:
setting and maintaining synchronization of an internal time register of each of the one or more test instruments to a common clock cycle by using a global clock signal of a master clock, the common clock cycle providing common clock time values for scheduling test events;
inserting bus words into the communication ring to carry the bus words to each of the one or more test instruments, the inserted bus words including at least one bus word specifying a scheduled common clock time value for performing a test event by a target test instrument; and
reading, by the target test instrument, the at least one bus word and using the scheduled common clock time value and the common clock cycle in the internal time register of the target test instrument to determine when to perform the test event.

31. The method of claim 30, further comprising:
inserting into the communication ring a partial sync word that describes a first aspect of a particular test event, the first aspect being monitored by a first test instrument; and
adding to the partial sync word information that describes a second aspect of the particular test event, the second aspect being monitored by a second test instrument.

32. The method of claim 31, further comprising:
processing the partial sync word to determine whether the particular test event has been completed.

33. A system for controlling two or more test instruments that are configured to test one or more integrated circuits, the system comprising:
a master clock connected to each of the two or more test instruments, the master clock being configured to provide, through a parallel and dedicated clock signal path, a master clock signal to each of the two or more test instruments; and
a controller connected to a communication ring formed by connecting together the two or more test instruments, each of which includes an input port and an output port, the output port of a test instrument in the communication ring being connected only to the input port of a succeeding test instrument in the communication ring, the input port of the test instrument being connected only to the output port of a preceding test instrument in the communication ring, wherein data words are propagated through the communication ring such that a data word provided to the input port of the test instrument is provided to the input port of the succeeding test instrument only through the output port of the test instrument, and wherein the controller is configured to synchronize counters of the two or more test instruments to derive a common clock time value from the master clock signal, the controller being able to synchronize counters of the two or more test instruments when a data word is inserted into the communication ring during synchronization.

* * * * *